US006455858B1

(12) United States Patent
Patt et al.

(10) Patent No.: US 6,455,858 B1
(45) Date of Patent: Sep. 24, 2002

(54) SEMICONDUCTOR RADIATION DETECTOR

(75) Inventors: Bradley E. Patt, Sherman Oaks; Jan S. Iwanczyk, Los Angeles; Carolyn R. Tull, Orinda; Gintas Vilkelis, Westlake Village, all of CA (US)

(73) Assignee: Photon Imaging, Inc., Northridge, CA (US)

( * ) Notice: Subject to any disclaimer, the term of this patent is extended or adjusted under 35 U.S.C. 154(b) by 27 days.

(21) Appl. No.: 09/638,738

(22) Filed: Aug. 13, 2000

(51) Int. Cl.[7] ............................................. H01L 27/14
(52) U.S. Cl. .................. 250/370.14; 257/452
(58) Field of Search ...................... 250/370.14; 257/452

(56) References Cited

U.S. PATENT DOCUMENTS

| 3,529,161 A | | 9/1970 | Oosthoek et al. |
| 4,626,884 A | * | 12/1986 | Shannon ...................... 257/452 |
| 4,688,067 A | | 8/1987 | Rehak et al. |
| 4,837,607 A | | 6/1989 | Kemmer et al. |
| 4,885,620 A | | 12/1989 | Kemmer et al. |
| 5,424,565 A | | 6/1995 | Kemmer |
| 5,773,829 A | | 6/1998 | Iwanczyk et al. |

OTHER PUBLICATIONS

Patt, B.E., et al., "New Gamma–Ray Detector Structures for Electron Only Charge Carrier Collection Utilizing High–Z Compound Semiconductors," Nuclear Instruments and Methods in Physics Research, Section A: Accelerators, Spectrometers, Detectors and Associated Equipment, vol. 380, Issues 1–2, pp. 276–281, Oct. 1996.
Knoll, Glenn F., "Semiconductor Diode Detectors," Radiation Detection and Measurement, Second Edition, Chapter 11, John Wiley & Sons, Inc., United States, pp. 337–386, Copyright 1989.
J.S. Iwanczyk, et al., Large Area Silicon Drift Detectors for X–Rays– New Results, IEEE Transactions on Nuclear Science, vol. 46, No. 3, Jun. 1999, pp. 284–288.

\* cited by examiner

*Primary Examiner*—Constantine Hannaher
(74) *Attorney, Agent, or Firm*—Christie, Parker & Hale, LLP

(57) ABSTRACT

A semiconductor radiation detector is provided to detect x-ray and light photons. The entrance electrode is segmented by using variable doping concentrations. Further, the entrance electrode is physically segmented by inserting n+ regions between p+ regions. The p+ regions and the n+ regions are individually biased. The detector elements can be used in an array, and the p+ regions and the n+ regions can be biased by applying potential at a single point. The back side of the semiconductor radiation detector has an n+ anode for collecting created charges and a number of p+ cathodes. Biased n+ inserts can be placed between the p+ cathodes, and an internal resistor divider can be used to bias the n+ inserts as well as the p+ cathodes. A polysilicon spiral guard can be implemented surrounding the active area of the entrance electrode or surrounding an array of entrance electrodes.

43 Claims, 18 Drawing Sheets

FIG. 1 —PRIOR ART—

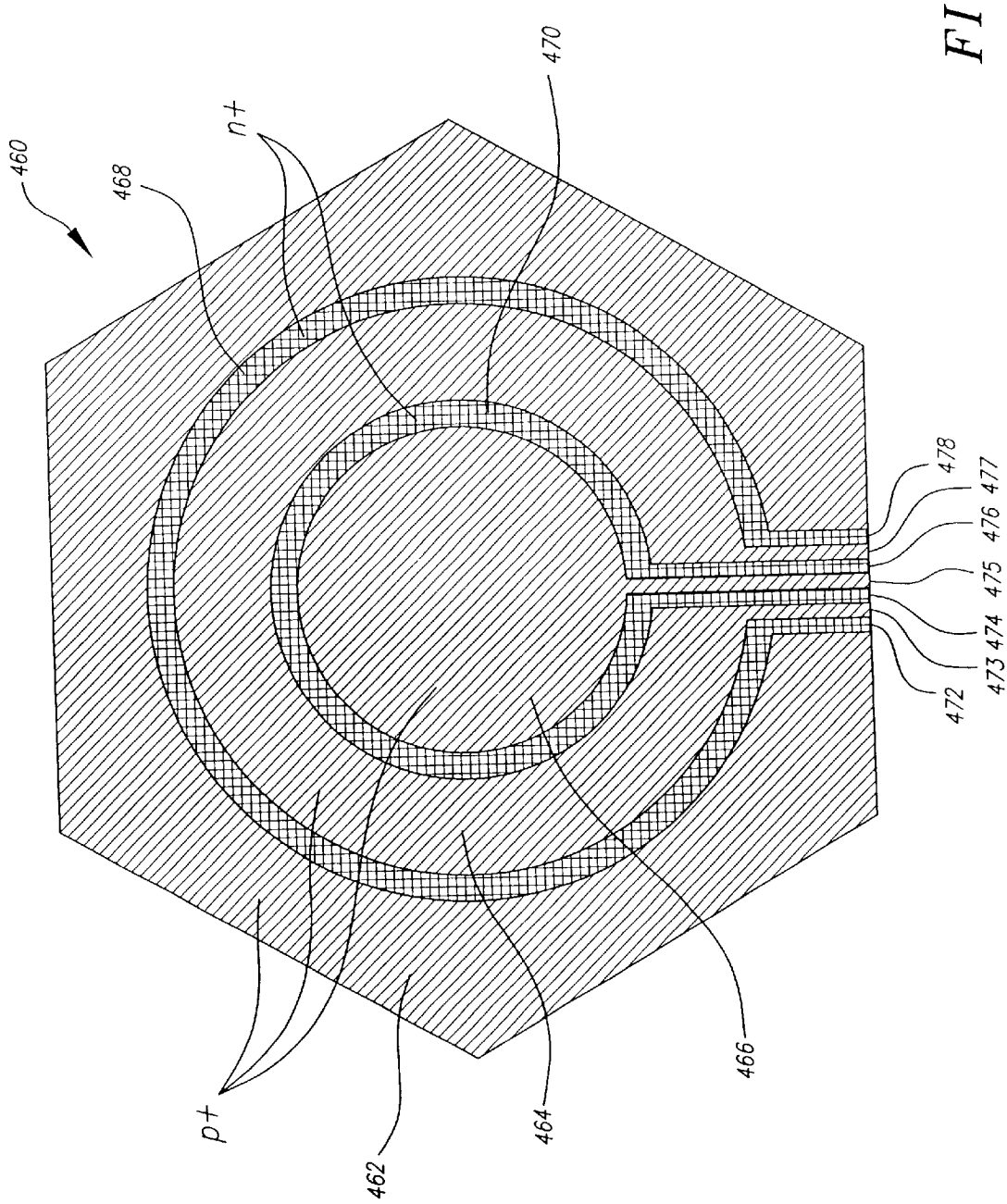

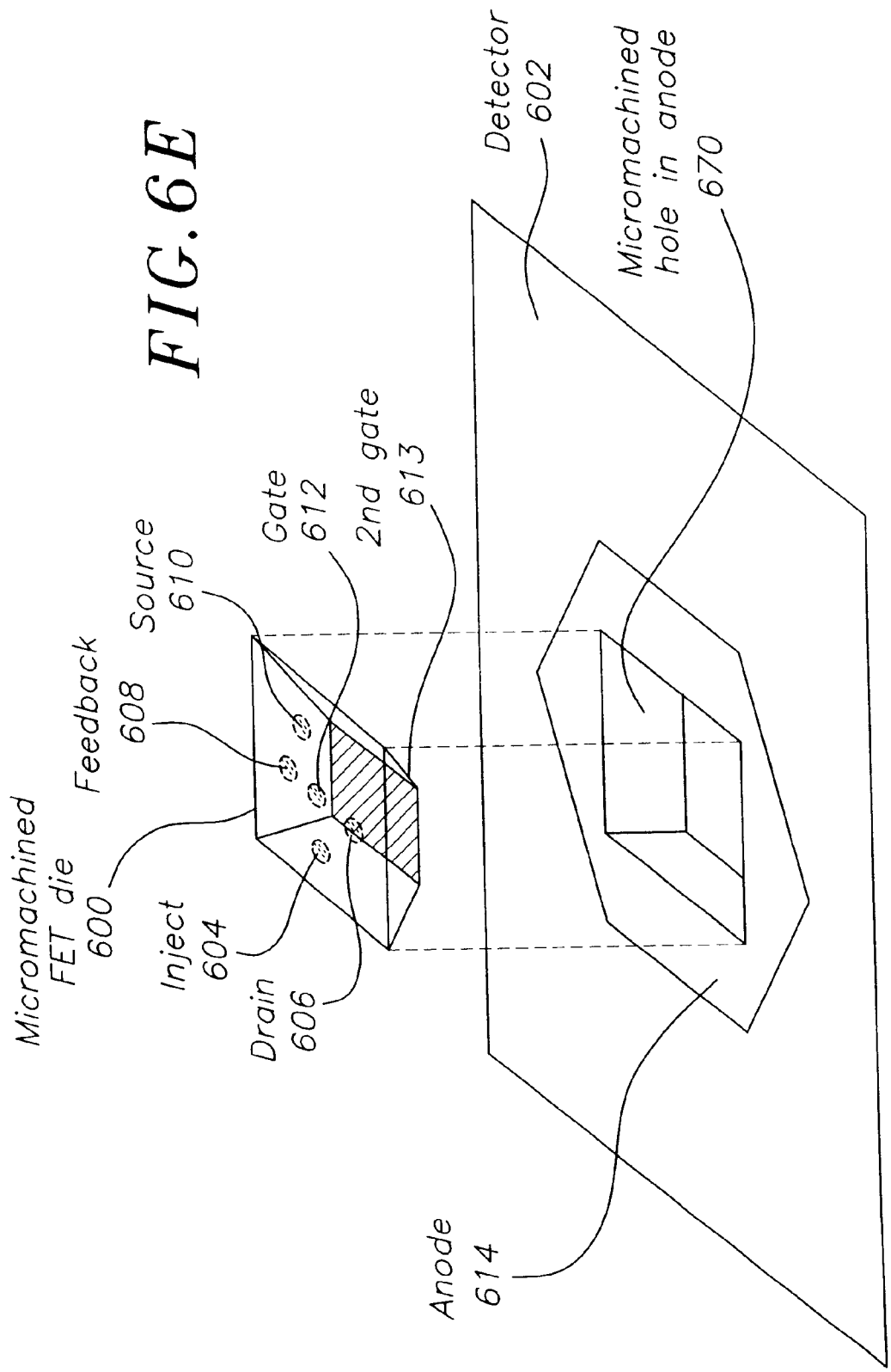

SEMICONDUCTOR RADIATION DETECTOR

STATEMENT REGARDING FEDERALLY SPONSORED RESEARCH OR DEVELOPMENT

This invention was made with government support under Small Business Innovation Research program (grant # DE-FG03-97ER82450) awarded by the Department of Energy. The Government has certain rights in this invention.

BACKGROUND OF THE INVENTION

The present invention relates generally to radiation imaging, and in particular, to apparatus and method for detection of x-ray and light photons using semiconductor radiation detectors, and to methods for fabrication of such devices. The semiconductor radiation detector may also be referred to as a semiconductor detector, a radiation detector or a detector.

Semiconductor radiation detectors typically have an active volume, which is depleted of free charge carriers, and is used to absorb at least some of the radiation to generate charges. There has been a continuing effort in the development of semiconductor radiation detectors with better sensitivity, higher energy resolution, lower electronic noise and larger active area that can operate at or near room temperature. In many applications, the detectors are also required to provide position or imaging information.

For example, semiconductor radiation detectors have been fabricated through the construction of a planar device that can be fully depleted from a small electrode. U.S. Pat. No. 4,688,067 titled "Carrier Transport and Collection in Fully Depleted Semiconductors by a Combined Action of the Space Charge Field and the Field Due to Electrode Voltages" discloses a fully depletable semiconductor detector, which is often referred to as a drift detector. Similar structures are also disclosed in U.S. Pat. No. 4,837,607 titled "Large Area, Low Capacitance Semiconductor Arrangement" and U.S. Pat. No. 4,885,620 titled "Semiconductor Element." An example of a drift detector is given in *Large Area Silicon Drift Detectors for X-Rays-New Results,* Jan S. Iwanczyk et al., IEEE Transactions on Nuclear Science, Vol. 46, No. 3, June 1999.

Semiconductor radiation detectors typically have an entrance window electrode to receive impinging radiation. X-ray and light photon detection efficiency of semiconductor radiation detectors is often limited by a dead layer at the entrance window electrode of the radiation detector, in which photons are absorbed but not detected. One of the major contributors to the dead layer is an undepleted region at the entrance window. The x-ray and light photons may be absorbed in the undepleted region before they reach the depletion (active) region, and the charges generated there often recombine and do not contribute to the output signal. This problem is critically important in the detection of low energy x-ray (<5 keV) and visible photons with wavelengths shorter than 600 nm, which are typically absorbed in a very thin layer of the semiconductor. An example of such application is the combination of a semiconductor radiation detector with a scintillating crystal for gamma-ray detection and spectroscopy.

In conventional semiconductor radiation detectors fabricated on n-type bulk material, the entrance window is typically uniformly doped with p+ impurities. The p+ impurity concentration at the entrance window is generally selected such that the depletion region comes close to the outer surface of the detector, but without actually touching the outer surface. Otherwise, large thermally-generated leakage currents may saturate the signal generated by detected radiation.

In a drift detector, due to the use of two superimposed electric fields, the dead layer at the entrance window is typically thick and non-uniform across the uniformly doped entrance window. Since the electric field magnitude at the entrance window electrode varies with location, the uniformly doped entrance window electrode typically depletes deeper (toward the outer surface of the entrance window) in those regions with higher electric field magnitude, compared to those regions with lower electric field magnitude. For example, the undepleted layer typically is the thinnest above the detector anode where the electric field is the strongest, and is thicker in other regions. In fact, at the periphery of the entrance window electrode, the electric field magnitude can be as low as one tenth of the electric field magnitude in the detector anode region. FIG. 1 illustrates a typical distribution of thickness of the undepleted region across the uniformly doped entrance window. The thicker undepleted layer at the periphery reduces quantum efficiency for the short wavelength light photons and low energy x-rays.

For best detection results, it is also important to consider coupling between the detector and readout electronics. Semiconductor radiation detectors typically have a low capacitance structure. In order to improve electronic noise performance of the low capacitance detector structures, e.g., as disclosed in U.S. Pat. No. 4,688,067, the total input capacitance (including the detector, input transistor, and parasitic capacitance due to interconnections and support structures) should be kept very small. The traditional approach to minimizing the parasitic capacitance is based on the integration of the input transistor to the detector anode, as shown for example in U.S. Pat. No. 5,424,565 titled "Semiconductor Detector."

When this approach is used, however, it is often difficult to design and fabricate a suitable transistor that will produce the desired characteristics of high signal-to-noise ratio, low capacitance, high $g_m/C_{in}$, and low 1/f noise. Integrating a transistor with characteristics similar to those of the best discrete JFET (junction field effect transistor) on a high-resistivity silicon wafer is often difficult since technological processes and requirements for fabricating the JFETs are usually quite different from those of the semiconductor radiation detectors. Thus, the integration of the transistor and the detector anode typically compromises the operating characteristics of both the detector and transistor.

Several discrete JFETs exist that offer low input capacitance (<1 pF) and superb characteristics in terms of $g_m/C_{in}$ (8.1 GHz) and 1/f noise (1.3 nV/Hz at 300K for total noise in the range of 1–100 KHz). These JFETs typically have capacitances measuring in a small fraction of a pico farad, making them suitable for use with low capacitance detectors. In addition, gain and noise characteristics of these highly optimized JFETs may be difficult to replicate in a process carried out under the conditions required for fabrication of low capacitance radiation detectors.

Semiconductor radiation detectors often include an outer guard structure at the perimeter of the detector. The outer guard structure can generally prevent premature breakdown, suppress surface leakage current and reduce electronic noise. Prior art detectors used biased or floating p+ rings as outer guard structures on n-type substrates. Unfortunately, structures of this type are typically sensitive to the surface charge density, $Q_f$, at the oxide/semiconductor interface, which can vary significantly from process to process. $Q_f$ is also typically dependent on the ambient conditions in which the detector operates, such as humidity and gas environment, and can take hours to stabilize after bias is applied. In addition, $Q_f$ can change by an order of magnitude or more after exposure to ionizing radiation. All this makes the optimization and long-term stability of the floating or biased p+ guard ring structures difficult to achieve.

Therefore, there is a need for a semiconductor radiation detector with a thin, relatively uniform undepleted region across the entrance window for optimized detection of low energy x-ray and light photons. There also is a need to reduce parasitic capacitance and coupling noise when the semiconductor radiation detector is coupled to a transistor. Further, there is a need to suppress surface leakage currents and reduce electronic noise, to do so in a way that is relatively insensitive to the surface charge density $Q_f$, which may vary in accordance with environmental conditions.

SUMMARY OF THE INVENTION

In one embodiment of the present invention, a radiation detector is formed on a semiconductor material. The radiation detector has first and second major surfaces and an edge surface. The edge surface is thinner in width than the major surfaces. The radiation detector also includes a rectifying entrance electrode on or affixed to the first major surface, and a second rectifying electrode formed on the second major surface. The second rectifying electrode includes a plurality of electrodes. The radiation detector also includes a collection electrode including an ohmic contact located on the second major surface. The radiation detector includes biasing areas for applying predetermined bias voltages to the electrodes in order to reverse bias rectifying junctions and to steer bulk majority charge carriers produced by radiation interactions in the detector towards the collection electrode. The rectifying entrance electrode is segmented into segments as to provide an undepleted region having a substantially uniform thickness across the entrance electrode when the predetermined bias voltages are applied.

In another embodiment of the present invention, a radiation detector fabricated on a semiconductor material includes an entrance window on a first side and multiple p+ electrodes on a second side. Biased n+ inserts are placed between the plurality of p+ electrodes. The n+ inserts may be biased differently from one another. The p+ electrodes may also be biased differently from one another. A resistor divider may be used to bias the p+ electrodes. The resistor divider may also be used to bias the n+ inserts.

In yet another embodiment of the present invention, a radiation detector formed on a semiconductor material has a guard structure, which may be spiral in form, that extends around at least a portion of a surface area of the detector active area. The guard structure may be made of polysilicon or any other suitable material, and it may also be biased. The guard structure may be placed around an active area of an entrance electrode on a first side. The guard structure may also be placed around detector structures on a second side. The guard structure may also be placed around an array of entrance electrodes.

In yet another embodiment of the present invention, a radiation detector formed on a semiconductor material includes a collection electrode and a transistor coupled to the collection electrode in a manner as to reduce coupling noise and parasitic capacitance. The transistor may be a JFET, a MOSFET, a BJT or any other suitable transistor. The transistor may be coupled to the collection electrode using a bump bonding technique. The collection electrode may be coupled to a gate terminal of the transistor using bump bonding techniques, while at least one of other transistor terminals is coupled to an isolating interconnection layer. The isolating interconnection layer may support the transistor, and the collection electrode may be coupled to a gate terminal of the transistor using a wire bonding technique. The collection electrode may be micro-machined as to create a hole with an opening, and a transistor die may be micro-machined as to allow the transistor die to fit within the hole in the collection electrode.

BRIEF DESCRIPTION OF THE DRAWINGS

FIG. 4C is a plan view schematic of an implementation of entrance electrode with physical separation of p+ segments in another embodiment of the present invention;

FIG. 6E is a sketch of a detector with transistor inserted into the detector anode using a micromachining technique;

DETAILED DESCRIPTION

In one embodiment of the present invention, the entrance electrode preferably is segmented across the outer surface through the use of variable doping concentrations of impurities. The segmentation of the entrance electrode preferably improves its performance for detection of low energy x-ray and light photons. The impurity profile of the segments preferably is selected to provide a relatively thin and substantially uniform undepleted region across the entrance electrode. For example, the depth of the undepleted region preferably is less than 0.1 micro meter ($\mu$m).

Figure 2:
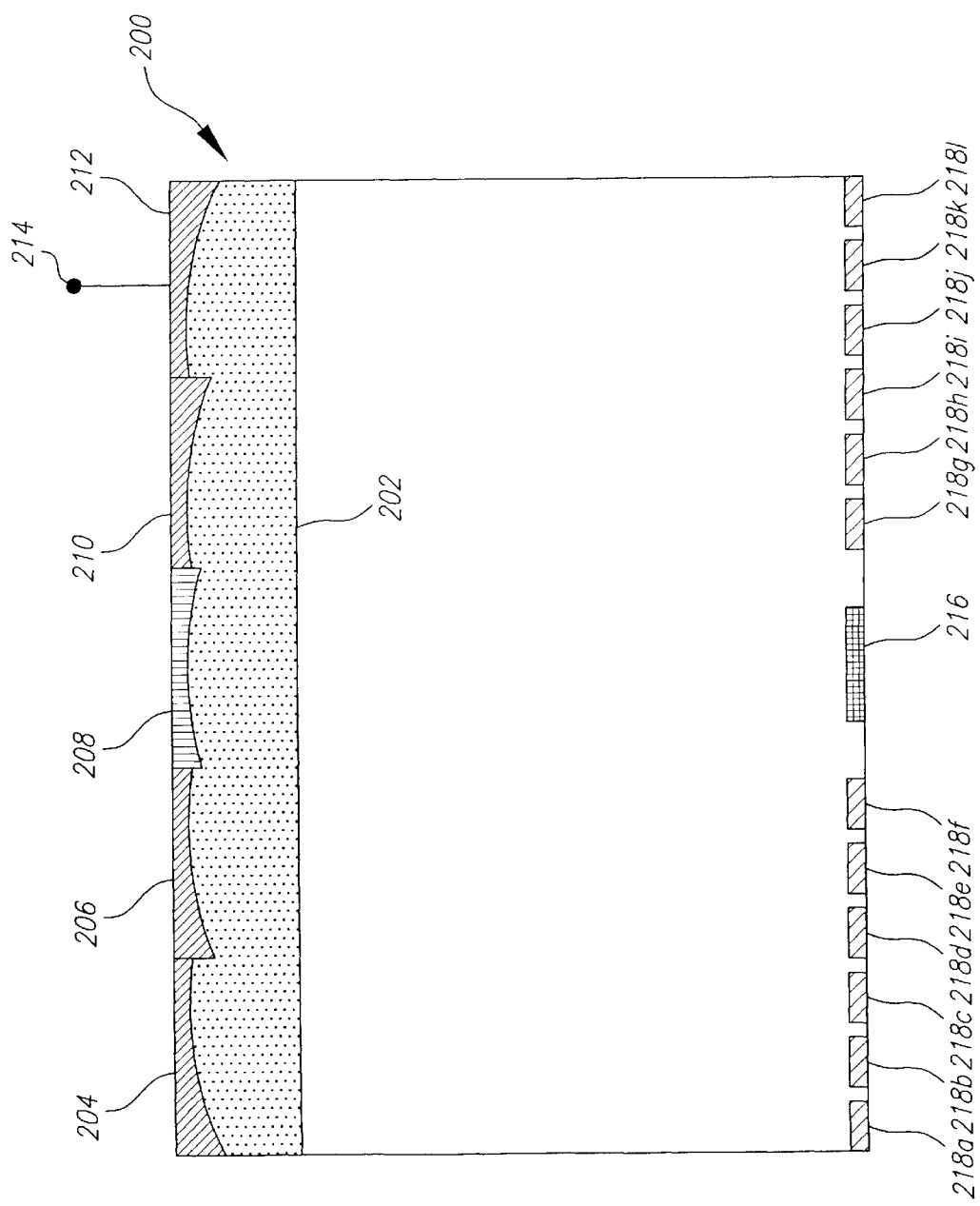
FIG. 2 is a cross-sectional schematic of a semiconductor radiation detector with segmentation of the entrance electrode using variable doping concentrations in one embodiment of the present invention.

FIG. 2 is a cross-sectional schematic of a semiconductor radiation detector 200 in operation in the embodiment where the entrance electrode is segmented across the outer surface. The entrance electrode may also be referred to as a rectifying entrance electrode. The semiconductor radiation detector 200 is fabricated using a bulk semiconductor material. In this embodiment, lightly doped n-type silicon is used as the bulk material. In other embodiments, other semiconductor material, e.g., gallium arsenide (GaAs), may be used. In addition, p-type material may be used instead of the n-type material.

In operation, the semiconductor radiation detector 200 includes a depleted p+ region 202 on an n-type substrate. The semiconductor radiation detector 200 also includes p+ doped regions 204, 206, 208, 210 and 212. The p+ doped regions 204, 206, 208, 210 and 212 are at the outer surface of the entrance electrode. The semiconductor radiation detector 200 preferably is electrically biased at a biasing point 214. The biasing point 214 preferably is biased with a voltage between −60 Volts to −150 Volts. Other potential may be used to bias the entrance electrode in other embodiments. The semiconductor radiation detector 200 is particularly well suited for small detectors with active area radius not exceeding a few mm, e.g., 2 to 4 mm.

In this embodiment, the p+ doped regions having different doping concentrations may be in the shape of substantially concentric circular regions at the outer surface of the entrance electrode. For example, the p+ region 208 may be a substantially circular region at about the center of the concentric circular regions. The p+ regions 206 and 210 may be a part of a ring-shaped circular region surrounding the p+ region 208, and the p+ regions 204 and 212 may be a part of a ring-shaped circular region surrounding the p+ regions 206 and 210. In other embodiments, the p+ regions may have shapes other than that of substantially concentric rings. For example, the p+ regions may have hexagonal or other polygonal shape in other embodiments.

The semiconductor radiation detector 200 also includes back side electrodes on the side of the bulk material, e.g., semiconductor wafer, opposite the side of the entrance electrode. The back side electrodes in this embodiment include an n+ anode 216 and multiple p+ cathodes 218a–218l. The multiple p+ cathodes may also be referred to as rectifying electrodes or as electrodes that make up a rectifying electrode. The n+ anode 216 preferably has a circular or hexagonal shape. In other embodiments, the n+ anode 216 may have other polygonal shapes.

The p+ cathodes preferably are fabricated as concentric rings, which may also be referred to as drift rings. For example, the p+ cathodes 218f and 218g preferably are on the same ring and biased with substantially the same potential, the p+ cathodes 218e and 218h preferably are on the same ring and biased with substantially the same potential, the p+ cathodes 218d and 218i preferably are on the same ring and biased with substantially the same potential, and so on. In other embodiments, the p+ cathodes may have other polygonal shapes, such as hexagonal shape.

The charges created by the detected radiation preferably are collected by the n+ anode 216 and provided to underlying readout electronics (not shown). The p+ cathodes 218a–218l preferably are biased at monotonically decreasing potentials (becoming more negative) in the radial direction away from the center as to produce a potential gradient from the front to the back of the semiconductor radiation detector 200 so that the created charges are drifted toward the n+ anode 216. For example, the potential at the p+ cathodes 218e and 218h is more negative than the potential at the p+ cathodes 218f and 218g, the potential at the p+ cathodes 218d and 218i is more negative than the potential at the p+ cathodes 218e and 218h, and so on.

For example, the n+ anode (detector anode) 216 preferably has a voltage range from approximately 0 Volt (ground) to approximately −20 Volts with respect to ground. The potential at the p+ cathodes 218f and 218g preferably is between approximately −10 Volts and approximately −40 Volts, and is typically approximately −20 Volts. When the detector area is approximately 0.5 cm$^2$, the potential at the outer most p+ cathodes, which may be farther away from the n+ anode 216 than the p+ cathodes 218a and 218l, preferably is between approximately −90 Volts and approximately −250 Volts, and is typically between −120 and −250 Volts.

The entrance electrode in the semiconductor radiation detector 200 preferably is doped with the following doping concentrations. For the central section about the p+ doped region 208 and above the n+ anode 216, the entrance electrode preferably has a depth-integrated activated doping concentration which is greater than the product of the doping concentration of the bulk material and the wafer thickness. In one embodiment, this depth-integrated activated doping concentration is approximately 6×10$^{10}$ atoms/cm$^2$. The entrance electrode dopants preferably are concentrated as close to the outer surface as possible (i.e. with as little diffusion into the substrate as possible) in order to achieve a high quantum efficiency window. For example, in this embodiment, the diffusion into the outer surface preferably is less than or equal to 0.1 $\mu$m.

The p+ doping concentrations of the p+ doped regions preferably gradually decrease with each successive ring (or other polygonal shaped p+ region) going further out from the detector center (p+ doped region 208). The doping concentration of the outermost ring (or other polygonal shaped p+ region), which may be farther away from the center p+ doped region 208 than the p+ doped regions 204 and 212, preferably is approximately 10% to 20% (approximately 6×10$^9$ atoms/cm$^2$ to 1.2×10$^{10}$ atoms/cm$^2$) of the doping concentration at the p+ doped region 208.

The bulk material used to fabricate the semiconductor radiation detector may be silicon or any other suitable semiconductor material used to fabricate radiation detectors. When the bulk material is n-type, p+ impurities are used. In other embodiments, p-type bulk and n+ impurities may be used. For example, p+ impurities may include but not limited to boron (B), and n+ impurities may include but not limited to phosphorus (P). In one embodiment of the present invention, the bulk material used to fabricate the semiconductor radiation detector 200 preferably includes approximately 1 kOhm-cm to approximately 5 kOhm-cm n-type silicon, with the typical bulk material being approximately 2 kOhm-cm to approximately 3 kOhm-cm silicon. The bulk material may also be neutron transmutation-doped material.

The thickness of the wafer preferably is between approximately 0.2 mm and approximately 1.0 mm, with the typical thickness between approximately 0.25 mm and approximately 0.40 mm. The radius of the active area preferably is between approximately 0.5 mm to approximately 20 mm, with the typical radius between approximately 4 mm to approximately 10 mm for large-area x-ray or light detectors, and between approximately 0.5 mm and 4 mm for fast timing applications.

In another embodiment, the segmentation of the outer surface of the entrance electrode preferably is achieved through physical separation of the doped regions using separation regions. The separation regions preferably are kept small in comparison to the p+ doped regions in order to maintain substantially uniform sensitivity to x-ray and light photons and to maintain substantially low leakage current generated at the entrance surface. The doped regions of the entrance electrode may or may not be biased separately.

Figure 3:
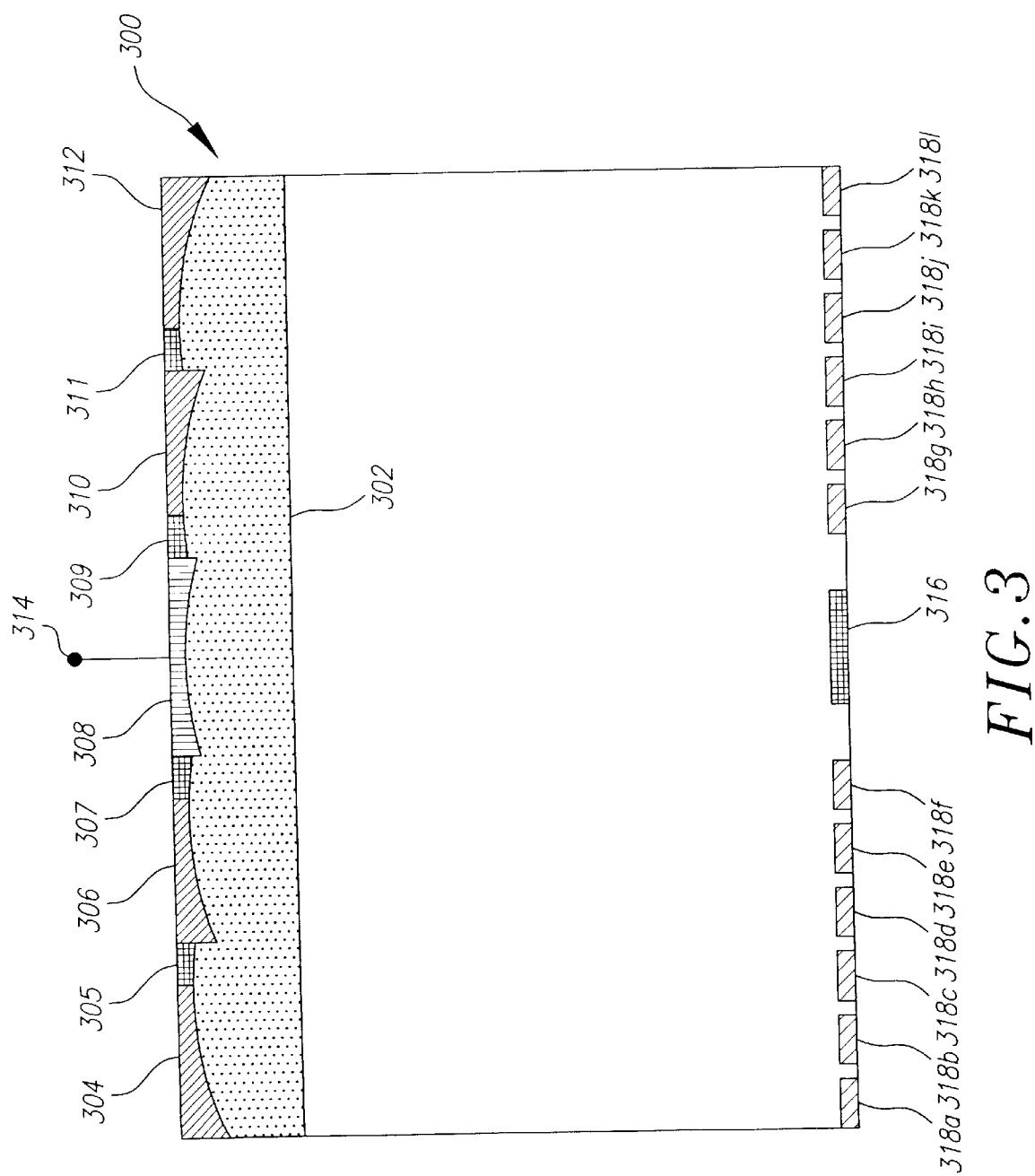
FIG. 3 is a cross-sectional schematic of a semiconductor radiation detector with physical segmentation of the entrance electrode combined with application of different doping concentrations in another embodiment of the present invention.

FIG. 3 is a cross-sectional schematic of a semiconductor radiation detector 300 in an embodiment where the outer surface of the entrance electrode is physically segmented. The semiconductor radiation detector 300 is similar to the semiconductor radiation detector 200 of FIG. 2 except that the p+ doped regions having different doping concentrations are physically segmented by a number of floating n+ regions 305, 307, 309 and 311. When the p+ doped regions are arranged as concentric rings, the floating n+ regions are also arranged as concentric rings. For example, the n+ regions 307 and 309 form a ring shaped region surrounding the p+ doped region 308, and the n+ regions 305 and 311 form a ring shaped region surrounding the p+ doped regions 306 and 310.

In operation, the entrance electrode in this embodiment preferably is biased at a single biasing point 314. The biasing point 314 preferably is biased with a voltage between −60 Volts to −150 Volts. In other embodiments, each of the p+ doped regions may be biased separately. In addition, the n+ regions may be biased separately. The n+ regions 305, 307, 309 and 311 used as separation regions preferably are kept very small in comparison to the p+ doped regions 304, 306, 308, 310 and 312 in order to maintain substantially uniform sensitivity to x-ray and light photons and to maintain substantially low leakage current generated at the entrance surface.

The semiconductor radiation detector includes an n+ anode 316 to collect charges created by the entrance electrode, and multiple p+ cathodes 318a through 318l to generate potential to facilitate channeling the created charges towards the n+ anode 316. The p+ cathodes 318a–318l preferably are biased at monotonically decreasing potentials (becoming more negative) in the radial direction away from the center similarly to the p+ cathodes 218a–218l of the semiconductor radiation detector 200 in FIG. 2. The potentials at the p+ cathodes are also similar to the potentials at the p+ cathodes of the detector 200.

The doping concentrations of the p+ doped regions (ring or other polygonal shaped) of the semiconductor radiation detector 300 preferably are substantially the same as the doping concentrations of the p+ doped regions of the semiconductor radiation detector 200 in FIG. 2. In other words, the doping concentration at the detector center (the p+ doped region 308) preferably is greater than the product of the doping concentration of the bulk material and the wafer thickness, and the doping concentration gradually decreases. At the outermost p+ doped region, which may be farther away from the center than the p+ regions 318a and 318l, the doping concentration preferably is approximately 10% to 20% of the doping concentration at the p+ doped region 308.

Figure 4A:
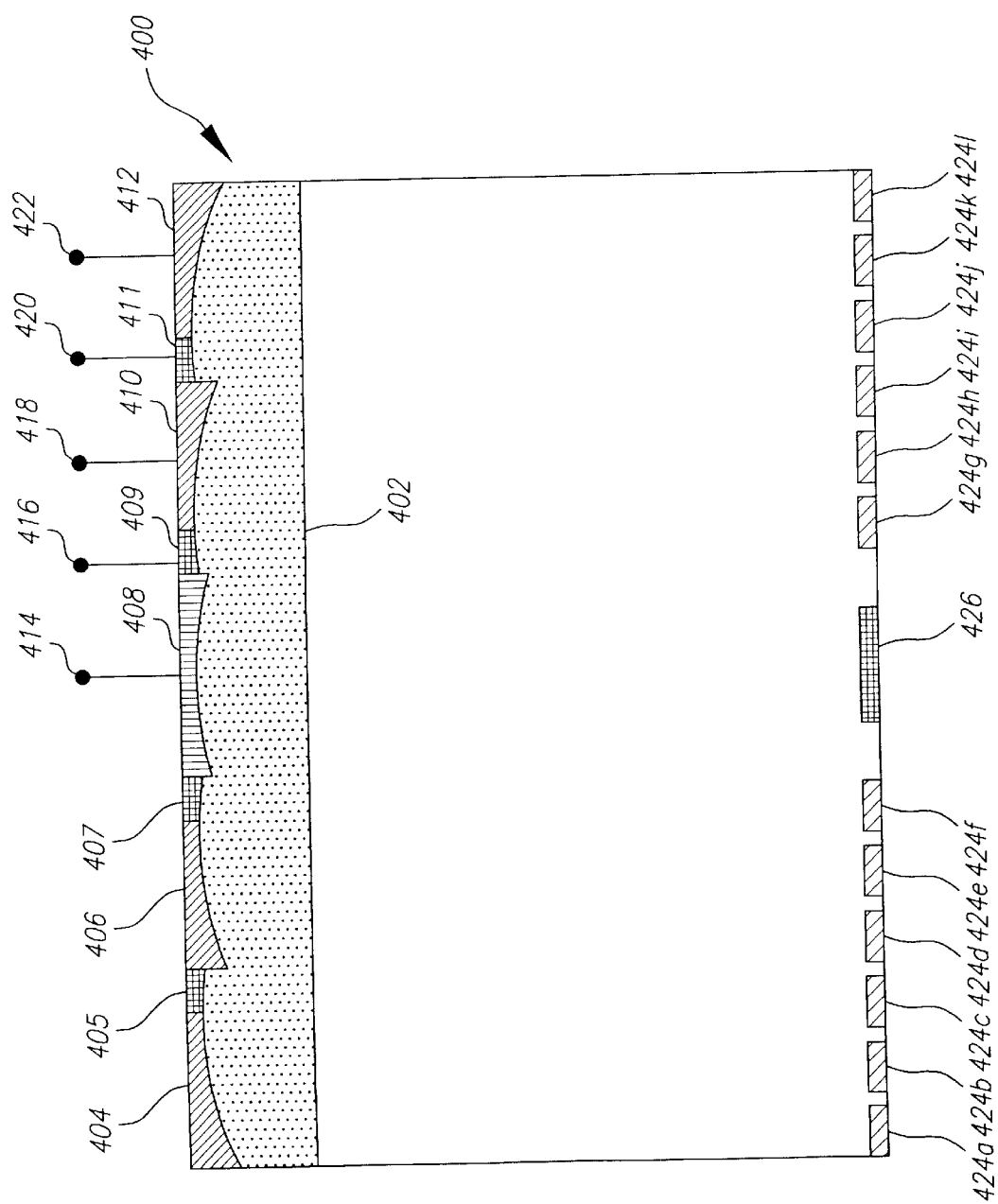
FIG. 4A is a cross-sectional schematic of a semiconductor radiation detector showing segmentation of the entrance electrode combined with biasing of the segments.

FIG. 4A is a cross-sectional schematic of a semiconductor radiation detector 400 in another embodiment of the present invention. The semiconductor radiation detector 400 preferably includes a depleted p+ region 402 and a number of undepleted p+ regions. In one embodiment, the doping concentrations in all p+ regions of the entrance electrode are substantially the same except for the doping concentration at the p+ doped region 408, which is at the center of the detector.

In this embodiment, the doping concentration at the p+ doped region 408 preferably is greater than the product of the doping concentration of the bulk material and the wafer thickness, and the doping concentration at other p+ doped regions preferably is approximately 50% ($3 \times 10^{10}$ atoms/cm$^2$) of the doping concentration at the p+ doped region 408, which preferably is $6 \times 10^{10}$ atoms/cm$^2$.

Individually biasing entrance electrode segments typically provide distinct advantages. The bias voltage distribution at the entrance electrode segments may be adjusted in such a way as to minimize the transit time of the generated carriers. The individual biasing of the entrance electrode segments generally allows for more parallel and faster drift of the charge carriers over long distances, thus enabling the fabrication of devices with larger active areas and good timing characteristics.

Therefore, during operation of the semiconductor radiation detector in the embodiment illustrated in FIG. 4A, p+ doped regions 404, 406, 408, 410 and 412, and the n+ regions 405, 407, 409, 411 and 412 that physically segment the p+ doped regions are separately biased. For example, a biasing point 414 is used to bias the p+ doped region 408, a biasing point 416 is used to bias the n+ regions 407 and 409 on the same ring, a biasing point 418 is used to bias the p+ doped regions 406 and 410 on the same ring, a biasing point 420 is used to bias the n+ regions 405 and 411 on the same ring, and a biasing point 422 is used to bias the p+ doped regions 404 and 412 on the same ring.

During operation, biasing voltages at the p+ doped regions 404, 406, 408, 410 and 412 preferably range from −60 to −150 volts. The biasing voltages at the n+ regions 405, 407, 409, 411 and 412 preferably are 10 to 20 Volts more positive than the biasing voltages at the neighboring p+ regions.

The semiconductor radiation detector 400 having physical segmentation and biasing are particularly well suited for radiation detectors with active area radius greater than a few mm (e.g., greater than 2–4 mm) although physical segmentation and biasing may also be applied to radiation detectors having active areas smaller than a few mm.

In other embodiments, p+ doped regions of a semiconductor radiation detector may be variably doped, e.g., doped with substantially the same doping concentrations as the doping concentrations for the p+ regions of the semiconductor radiation detector 200 of FIG. 2 or the semiconductor radiation detector 300 of FIG. 3. The p+ doped regions and/or n+ inserts may be individually biased as the corresponding regions in the semiconductor radiation detector 400 of FIG. 4 in addition to being variably doped.

Figure 4B:
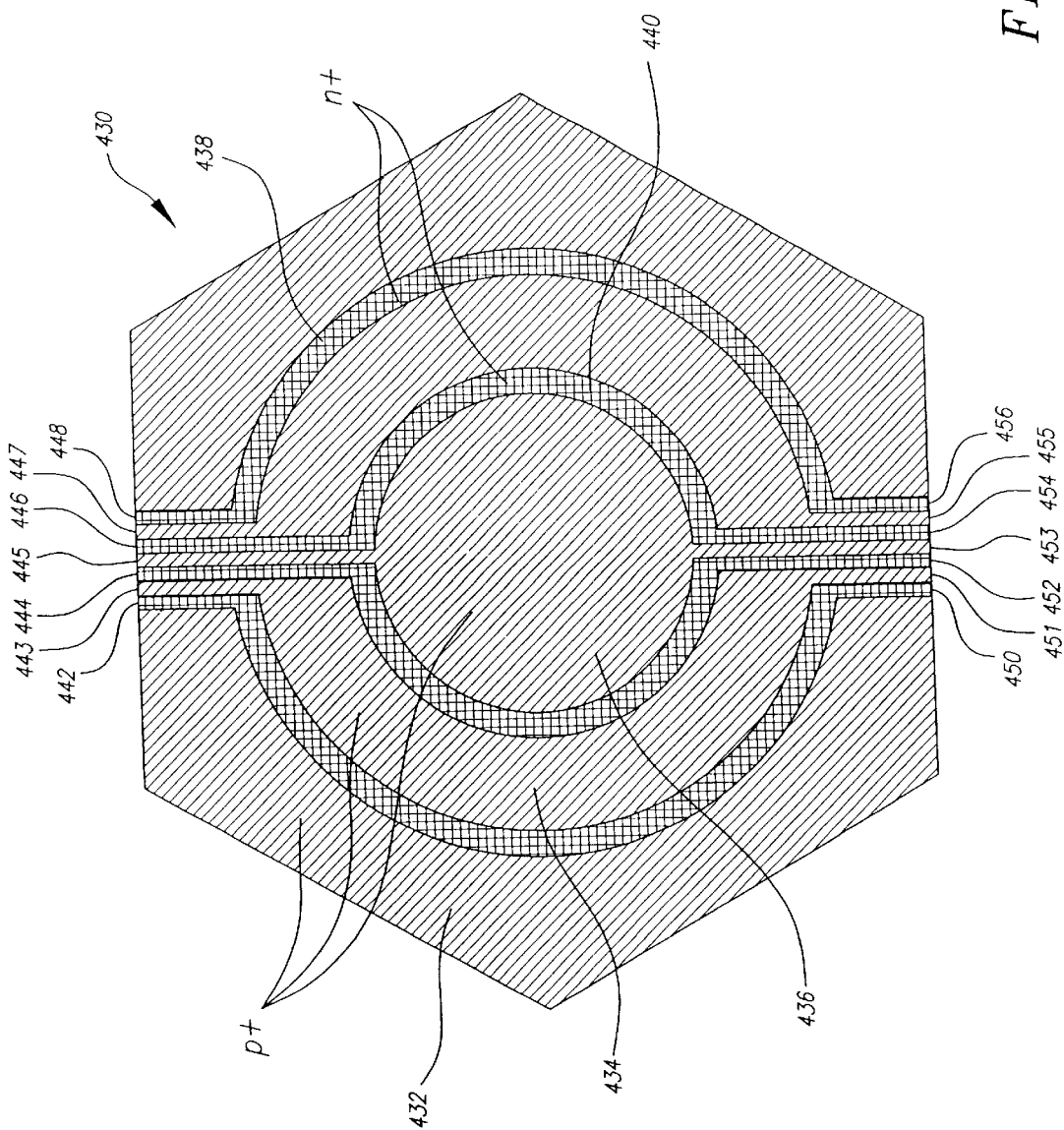
FIG. 4B is a plan view schematic of physical separation of the segmented p+ doped regions having variable doping concentrations in one embodiment of the present invention.
Figure 4D:
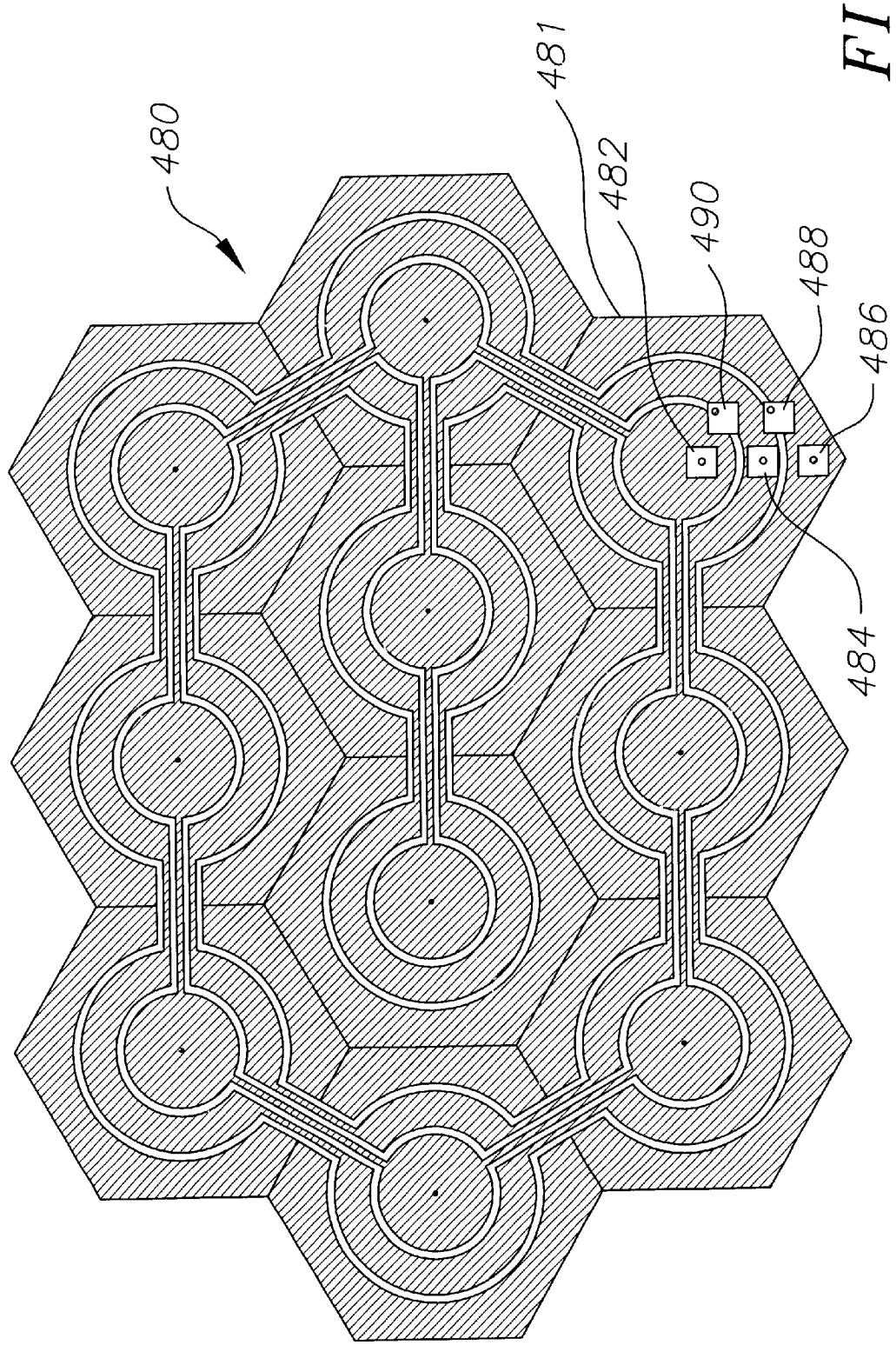
FIG. 4D is a schematic of an array of detectors with the entrance electrode with physical segmentation.

The layout for the physically segmented and biased entrance windows should be as shown in FIGS. 4B and 4C to allow easier and less obstructive bonding, as well as to allow the possibility of arranging them into monolithic arrays such as the one shown in FIG. 4D, where the entrance windows of multiple detector elements can be biased as a group from a small single biasing area preferably outside of the active area.

FIG. 4B is a plan view of an entrance electrode 430 in one embodiment of the present invention where p+ doped regions are physically segmented and separately biased. The p+ doped regions 432, 434 and 436 are separated from one another by n+ regions 438 and 440. For ease of bonding and coupling to other entrance electrodes in an array configuration, each of the inner p+ regions and the n+ regions are coupled to one or more leads. For example, the p+ region 436 at the detector center is coupled to leads 445 and 453. For another example, the n+ region 440 is coupled to leads 444, 446, 452 and 454.

FIG. 4C is a plan view of an entrance electrode 460 in another embodiment of the present invention. The entrance electrode 460 is similar to the entrance window electrode 430 of FIG. 4B except that the entrance window electrode 460 includes less number of leads coupled to each of the p+ and n+ regions. For example, an undepleted region 466 at the detector center in FIG. 4C is coupled to a single lead 475.

FIG. 4D is a plan view of multiple detector elements arranged in a monolithic array 480. Using leads coupled to p+ regions and n+ regions, the p+ regions and the n+ regions of one detector element are coupled to corresponding p+ and n+ regions, respectively, of other detector elements. Since all the p+ regions and the n+ regions are coupled to corresponding p+ regions and the n+ regions, respectively, of all other detector elements, the entrance windows of all the detector elements may be biased as a group from a small single biasing area preferably outside of the active area. Bonding pads are shown schematically in FIG. 4D and are larger in the figure than they would be on the device. They should not obstruct the incoming radiation. Additionally they could be located outside of the entrance window area.

For example, a detector element 481 is coupled to biasing points 482, 484, 486, 488 and 490 at p+ regions and n+ regions. Further, the p+ regions and the n+ regions of the detector element 481 are coupled to the corresponding n+ regions and p+ regions of every other detector element. Therefore, the p+ regions and the n+ regions in all the detector elements may be biased from the biasing points 482, 484, 486, 488 and 490, respectively.

Figure 1:
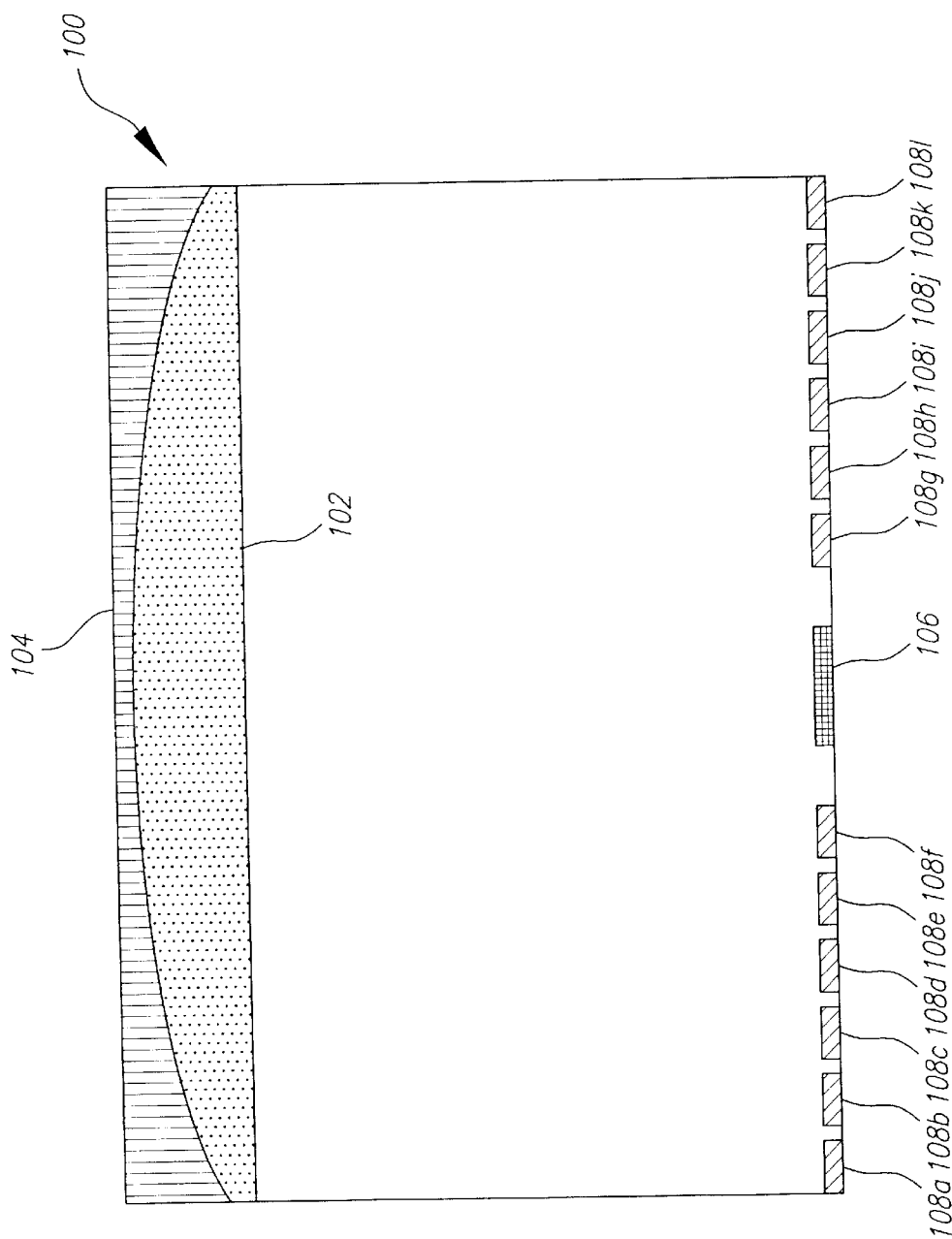
FIG. 1 is a cross-sectional schematic of a semiconductor radiation detector with conventional thickness and non-uniformity of the dead layer at the entrance electrode.
Figure 5:
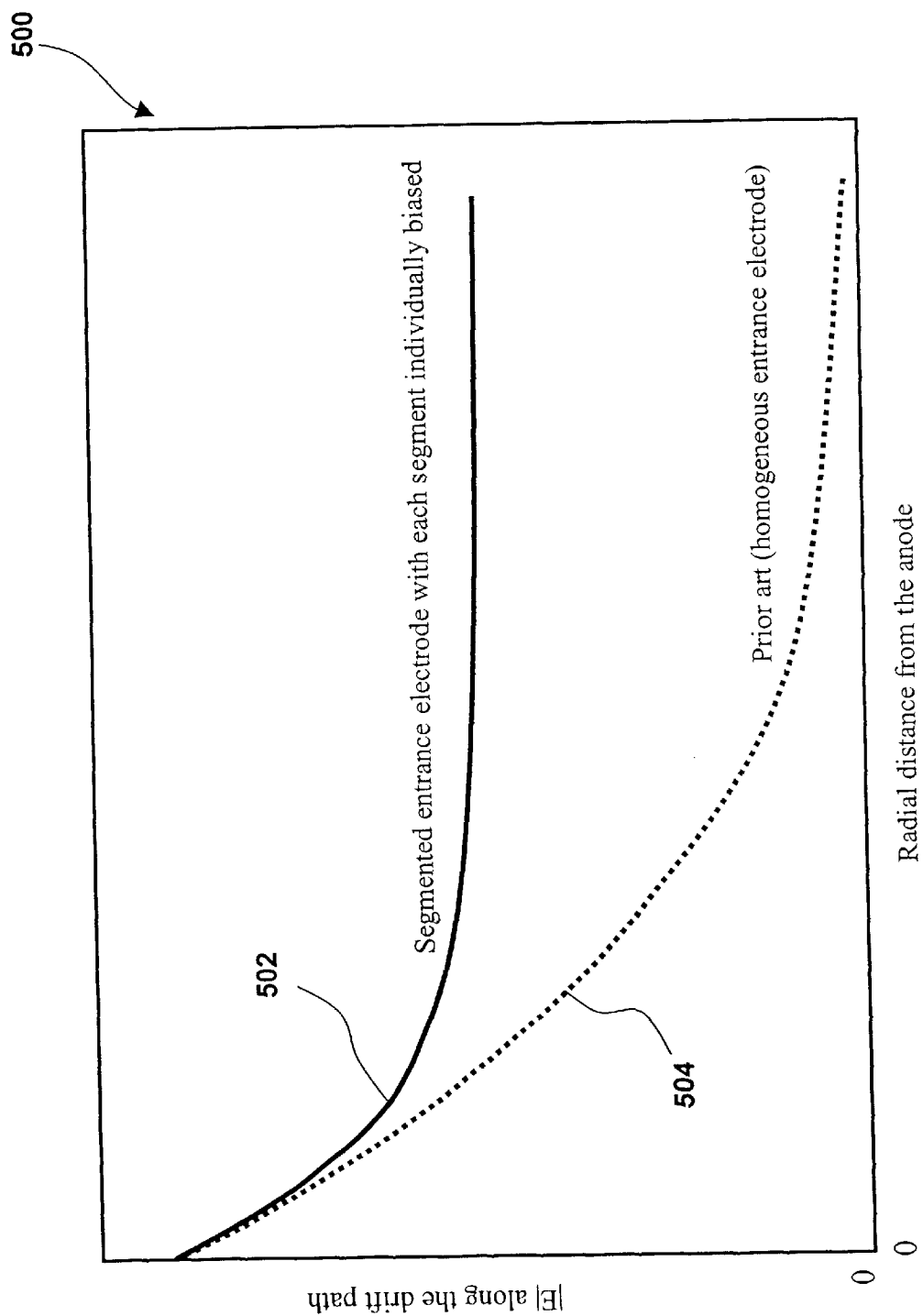
FIG. 5 is a graph illustrating a comparison between electric field distributions for a detector having an entrance electrode with individually biased segments and a detector with uniformly doped entrance electrode.

FIG. 5 is a graph 500 illustrating relative electric field magnitudes along the drift path as the radial distance from the detector anode, i.e., n+ anode, increases. A solid curve 502 represents electric field magnitudes, e.g., for the semiconductor radiation detector 400 of FIG. 4A. A dotted curve 504 represents electric field magnitudes, e.g., for the semiconductor radiation detector 100 of FIG. 1. The semiconductor radiation detector 100 has a homogeneous entrance electrode while the semiconductor radiation detector 400 has a segmented entrance electrode with each segment individually biased.

It can be seen in the graph 500 that the semiconductor radiation detector 400 generates relatively more uniform electric field with comparatively higher magnitudes than the semiconductor radiation detector 100. The relatively more uniform electric field typically results in higher and more uniform carrier drift speeds which makes it possible to make substantially larger detectors with good signal timing characteristics.

When coupling a semiconductor radiation detector to underlying readout electronics, parasitic capacitance and/or coupling noise associated with electrical connections may degrade the detector performance. Therefore, the semiconductor radiation detector preferably is coupled to the readout electronics in a manner as to reduce parasitic capacitance and coupling noise. A high performance, low capacitance junction field effect transistor (JFET) preferably is used to interface the semiconductor radiation detector to the readout electronics in order to match the capacitance of the detector and FET, and to avoid adding additional capacitance beyond this. In other embodiments, other types of transistors, e.g., a bipolar junction transistor (BJT) or a metal-oxide-silicon field effect transistor (MOSFET), may be used to interface the semiconductor radiation detector to the readout electronics.

In one embodiment, the JFET preferably is directly connected to the detector anode using bump bonding techniques. This typically requires a detector designed with additional bonding pads that can accommodate corresponding pads on the JFET structures. The detector anode preferably is directly bonded to the JFET gate. Other JFET terminals (drain, source, and resetting electrode) preferably have corresponding bonding pads on the detector structure placed over an insulating layer. A pre-amplifier feedback capacitor may also be built directly into the detector structure in a similar way.

Figure 6A:
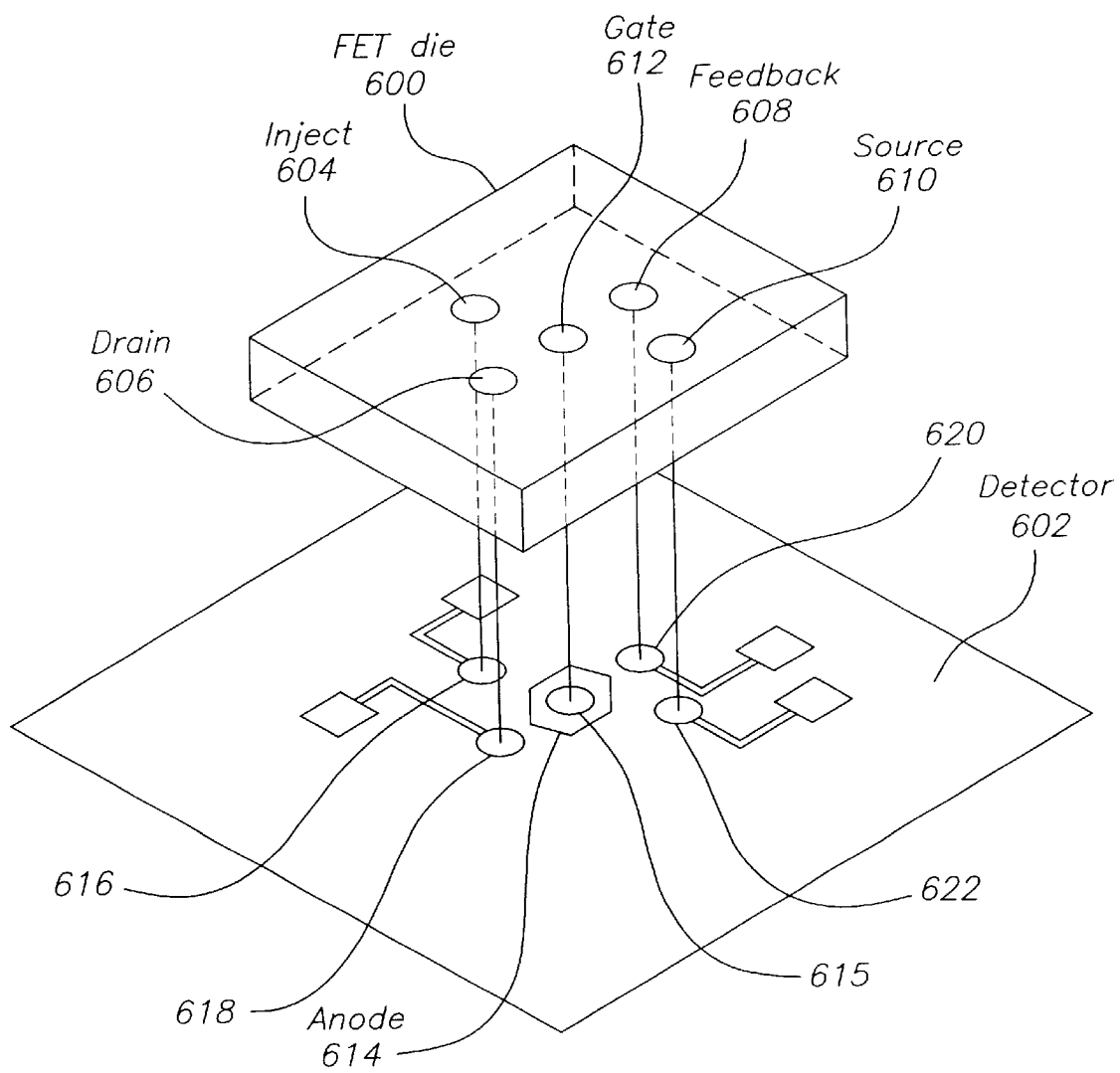
FIG. 6A is a sketch of a detector with transistor connected to the detector anode using bump bonding technique.

FIG. 6A is a diagram illustrating coupling between a FET die 600 and a semiconductor radiation detector 602 in one embodiment of the present invention. In this embodiment, the FET die 600, which includes a JFET, preferably is directly connected to a detector anode 614 using bump bonding techniques. Bonding pads 615, 616, 618, 620 and 622 preferably are fabricated on the semiconductor radiation detector 602 to couple the semiconductor radiation detector 602 directly to the FET die 600.

The detector anode 614 preferably is coupled to a bonding pad 615 to directly bond to a gate 612 of the JFET. Other JFET terminals such as a drain 606, a source 610, and a resetting electrode 604 preferably are directly coupled to corresponding bonding pads 618, 622 and 616, respectively, on the detector structure. The resetting electrode 604 preferably is used to inject charges into the JFET in order to reset it.

A pre-amplifier feedback capacitor may also be connected directly to the semiconductor radiation detector in a similar manner. The pre-amplifier feedback capacitor preferably is fabricated on the FET die. The FET die 600 preferably has a feedback bonding pad 608 to connect the feedback capacitor directly to a bonding pad 620 on the detector structure. In other embodiments, the feedback capacitor may be fabricated on a separate die.

A bump bonding technique is also used to couple a detector anode of the semiconductor radiation detector to the JFET gate in another embodiment of the present invention. However, in this embodiment, the rest of the JFET electrodes and feedback capacitor preferably are coupled to an isolating interconnection layer. The bump bonding between the detector anode and the JFET gate preferably is achieved through a hole in the isolating interconnection layer.

Figure 6B:
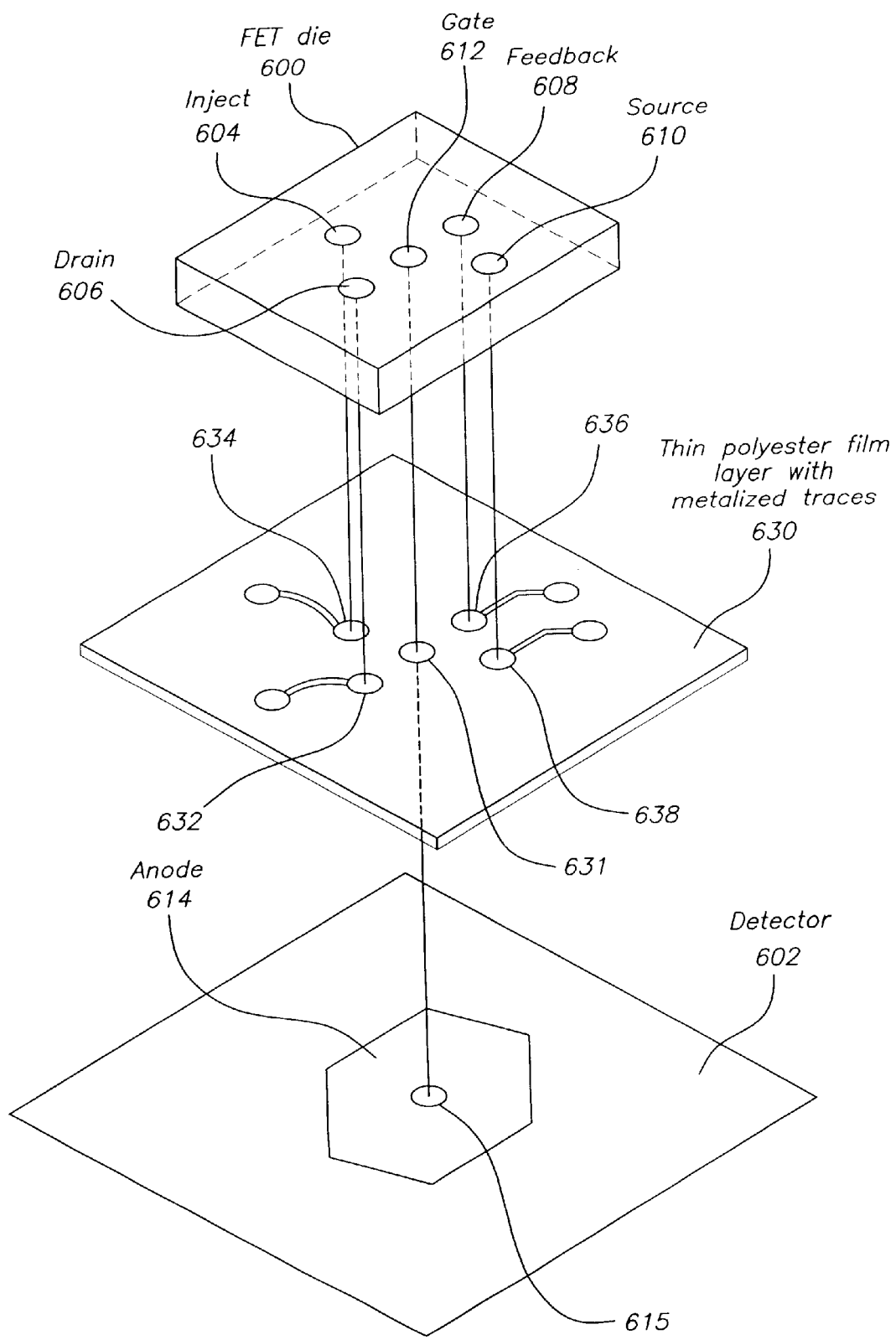
FIG. 6B is a sketch of a detector with transistor connected to the detector anode using bump bonding technique with use of thin polyester film (e.g., Mylar® foil) or ceramic substrates.

FIG. 6B is a diagram illustrating coupling between a FET die 600 and a semiconductor radiation detector 602 in this embodiment of the present invention. The semiconductor radiation detector 602 includes a detector anode 614, which preferably is coupled to a bonding pad 615. An isolating interconnection layer 630 preferably is placed between the FET die 600 and the semiconductor radiation detector 602. The isolating interconnection layer 630 preferably includes a thin polyester film (e.g., Mylar® foil), ceramic or other isolating material with conductives and bonding pads. Mylar® is a registered trademark of E. I. du Pont de Nemours and Company Corporation, Wilmington, DE. The conductives preferably include metalized traces, and the bonding pads preferably include metallic pads.

A bump bonding technique preferably is used to couple the bonding pad 615 on the detector anode 614 to the JFET gate 612 on the FET die 600. The bump bonding between the detector anode 614 and the JFET gate 612 preferably is achieved through a hole 631 in an isolating interconnection layer 630, which preferably is between the semiconductor radiation detector 602 and the FET die 600. Rest of the JFET electrodes and a feedback capacitor (preferably on the FET die 600) preferably are coupled to the isolating interconnection layer 630. A drain 606, a source 610, a resetting electrode 604 and a feedback bonding pad 608 preferably are coupled to bonding pads 632, 638, 634 and 636, respectively.

In another embodiment of the present invention, the detector anode preferably is not coupled to a JFET gate using bump boding techniques. Instead, a thin polyester film (e.g., Mylar200 foil), ceramic or other isolating interconnection layer preferably is used as a JFET carrier, and the isolating interconnection layer preferably couples the JFET to the detector anode.

Figure 6C:
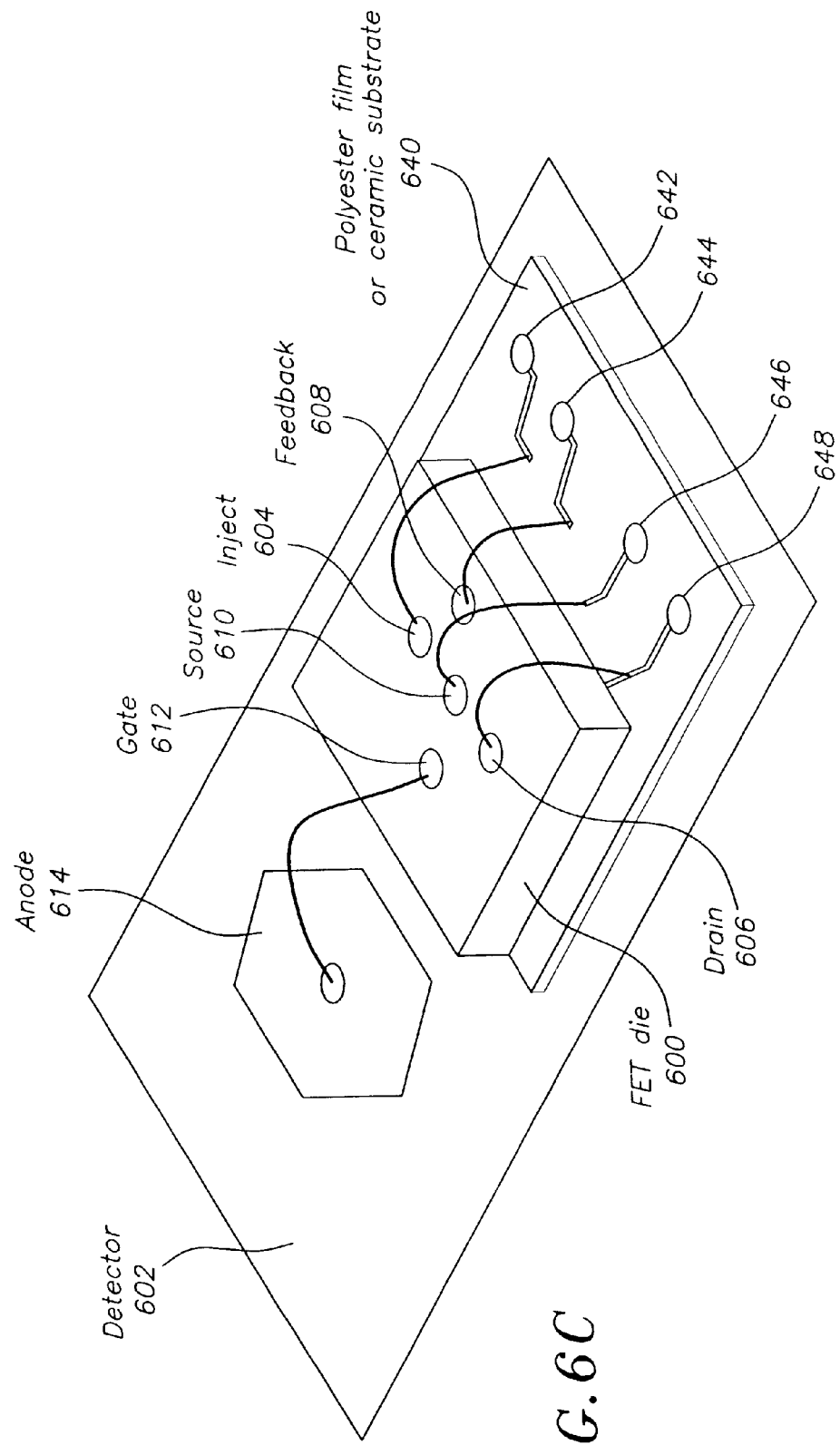
FIG. 6C is a sketch of a detector with transistor connected to the detector anode using a thin polyester film (e.g., Mylar® foil) or ceramic substrate with metal traces and wire bonds.

FIG. 6C is a diagram illustrating coupling between a FET die 600 and a detector 602 in an embodiment in which a detector anode 614 is coupled to a gate 612 of the JFET on the FET die 600 via a bonding wire. An isolating interconnection layer 640 with conductives and bondable pads preferably is used as a JFET carrier. The conductives may include metalized traces. The isolating layer 640 preferably includes a thin polyester film (e.g., Mylar® foil). In other embodiments, the isolating layer 640 may include a ceramic substrate or other isolating layer.

The JFET carrier 640 preferably allows the FET die 600 to be brought closely to the detector anode 614 as to reduce parasitic capacitance. The detector anode 614 preferably is coupled to the JFET gate 612 via a thin bonding wire, which preferably is very short to reduce parasitic capacitance and noise. For example, the bonding wire preferably is less than 2 mm in length. Other JFET terminals 604, 606 and 610 as well as a feedback bonding pad 608 are coupled to bonding pads 642, 648, 646 and 644, respectively, of the JFET carrier 640.

Figure 6D:
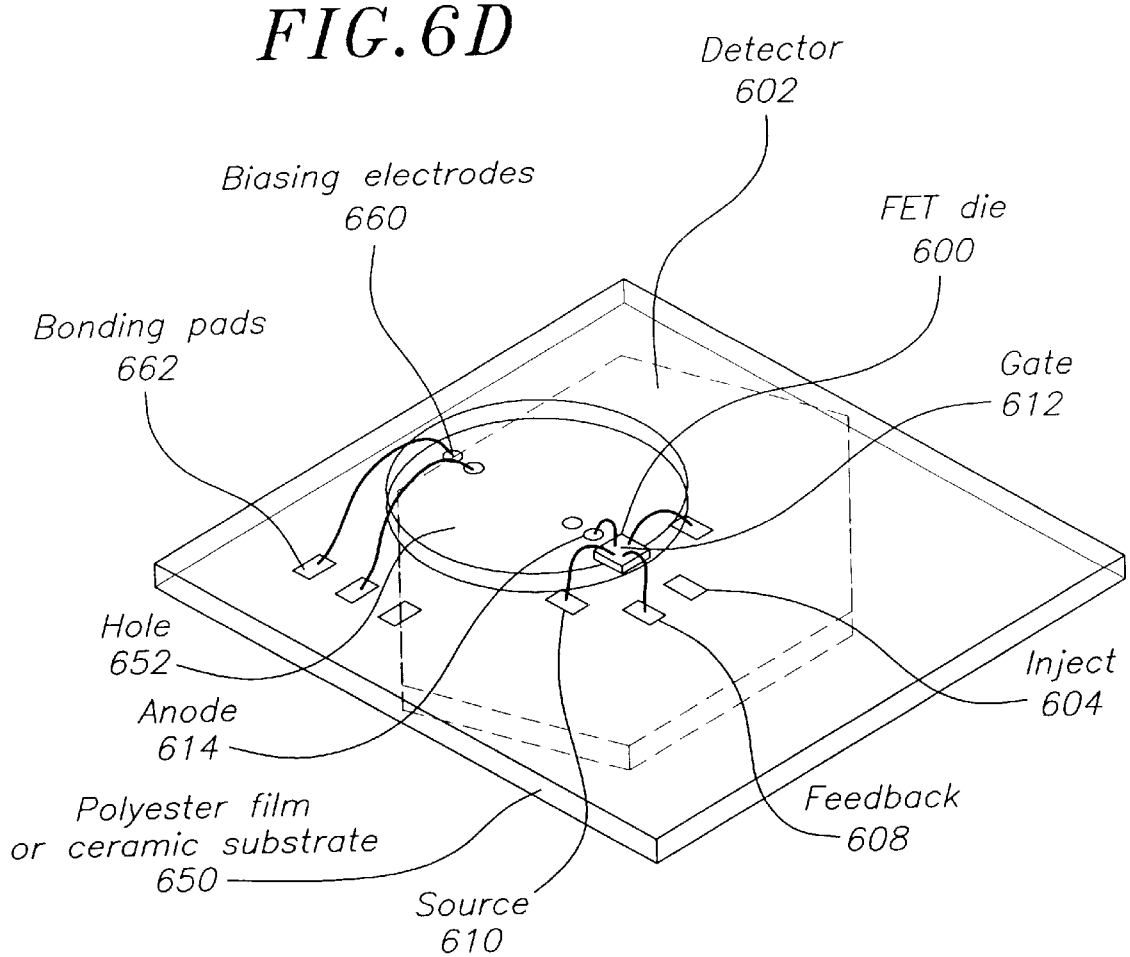
FIG. 6D is a sketch of a detector with transistor connected to the detector anode using wire bonding technique using an isolating substrate.

Another embodiment is shown in FIG. 6D. Here the detector 602 is bonded to one side of a ceramic substrate 650 and the FET die 600 is bonded to the opposing side of the substrate 650. The overall dimensions of the substrate 650 are similar to that of the detector 602. A hole 652 cut into substrate 650 allows the detector biasing electrodes 660 to be wire-bonded to bond pads 662 on the substrate 650. The hole also allows the anode 614 of the detector to be bonded to the gate 612 of the FET die 600. The edge of the hole 652 is located close to the anode 614 allowing the gate 612 of the FET die 600 to be positioned in close proximity to the anode 614 of the detector 602. Bond pads 662 for the injection 604, feedback 608, source 610, and drain 606 are placed on the substrate 650 to allow electrical interconnection.

Commercial transistor chips, e.g., FET die, containing a JFET are typically diced into blocks much larger than dimensions of actual transistor structures, e.g., the JFET structure. In another embodiment of the present invention, micro-machining techniques are used to insert the FET die containing the JFET into the detector anode of a semiconductor radiation detector.

FIG. 6E is a diagram illustrating coupling between a FET die 600 and a detector 602 in the embodiment in which micro-machining techniques are used to insert a FET die 600 into a detector anode 614 of a semiconductor radiation detector. The FET die 600 preferably is micro-machined to reduce size as to have dimensions similar to the dimensions of an actual JFET, and then placed into a corresponding cavity 670 micro-machined in the detector anode 614. The mechanical and electrical connections between the JFET on the FET die 600 and the detector 602 preferably are achieved through the deposition of insulating layers and corresponding interconnecting boding pads, which preferably are metallic pads.

In order to improve detector performance, n+ inserts may be placed on the back side of a semiconductor radiation detector. The n+ inserts preferably are introduced between the multiple p+ cathodes that are on the detector surface opposite the entrance electrode. Presence of the biased n+ inserts typically makes the detector substantially more immune to changes of the surface charges and less sensitive to ambient conditions. Additionally, n+ inserts preferably: 1) decrease the surface current, which in turn decreases the detector anode current, without the need for a guard anode; 2) reduce the "differential non-linearity" of the surface charges; and 3) reduce "warm up time" related to stabilization of the surface charges.

Figure 7A:
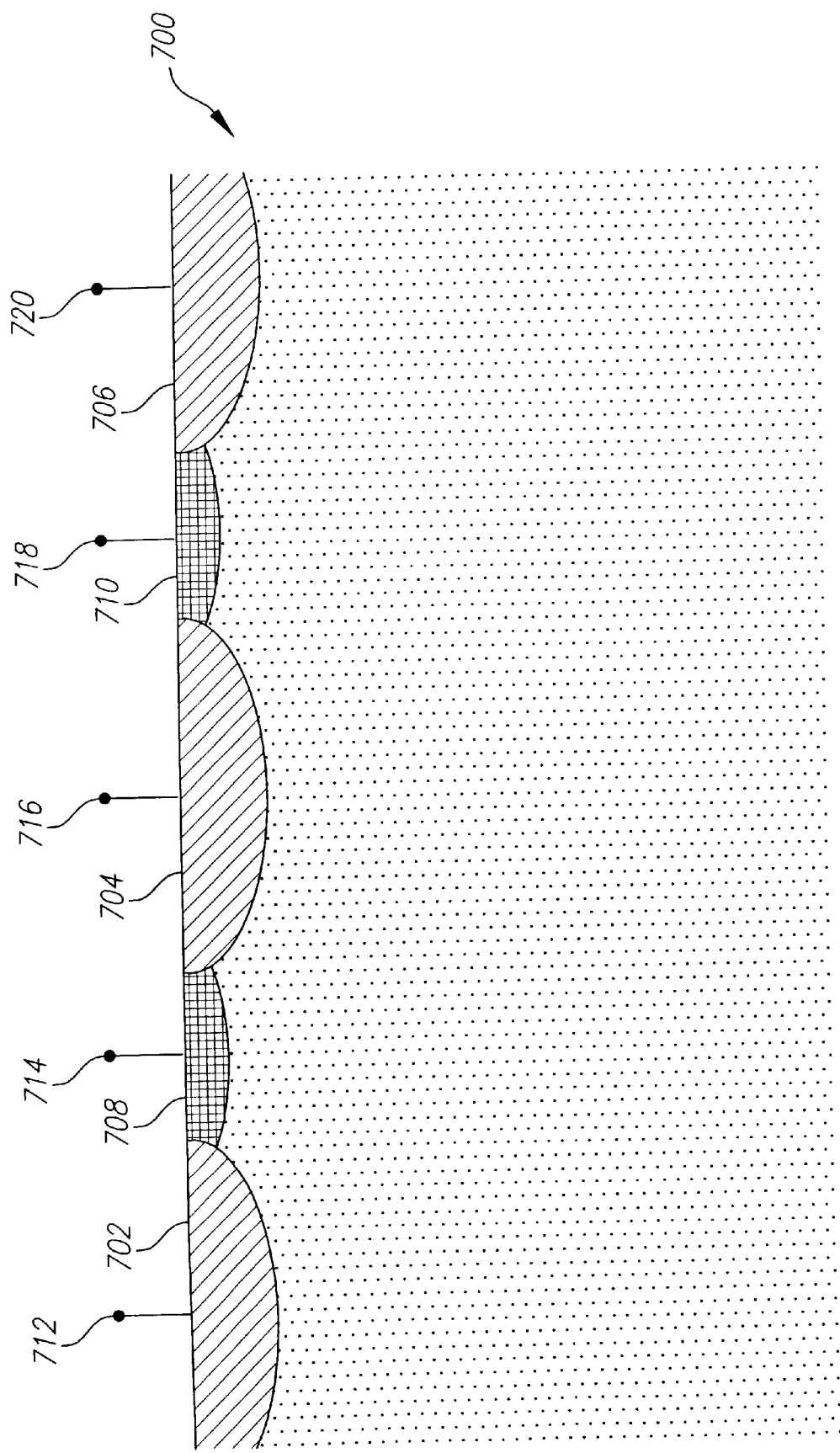
FIG. 7A is a cross-sectional schematic of a semiconductor radiation detector showing details of n+ inserts between multiple p+ electrodes, with appropriate bias on the n+ inserts.

FIG. 7A is a cross-sectional schematic of a semiconductor radiation detector 700 in one embodiment of the present invention where biased n+ inserts are placed between p+ cathodes on the back side of the wafer. On the back side, which may also be referred to as an anode side, of the semiconductor radiation detector, a number of concentric p+ cathodes 702, 704 and 706 are implemented. The p+ cathodes 702, 704 and 706 preferably are biased at biasing points 712, 716 and 720, respectively. Biased n+ inserts 708 and 710 preferably are placed between the p+ cathodes.

The n+ inserts 708 and 710 preferably are biased from biasing points 714 and 718, respectively. The n+ inserts preferably are biased to a suitable potential, which is more positive than the potentials applied to the neighboring p+ cathodes. For example, if the potentials at the p+ cathodes 702 and 704 are approximately −40 Volts and approximately −30 Volts, respectively, the potential at the n+ insert 708 may be approximately −20 Volts.

Figure 7B:
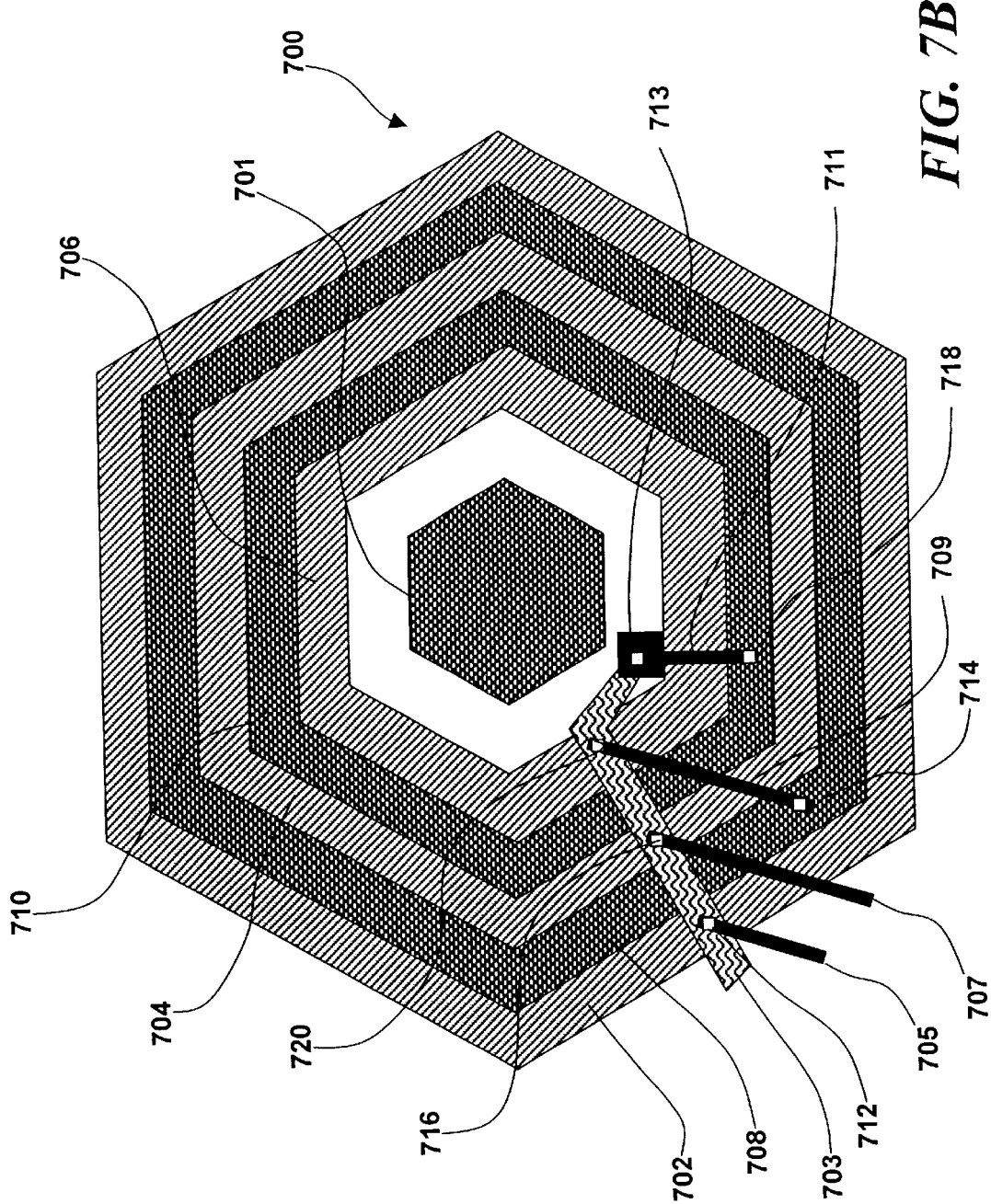
FIG. 7B is a plan view of a detector anode region of a semiconductor radiation detector showing biased n+ inserts between multiple p+ electrodes.

FIG. 7B is a plan view of electrodes on the back side of the semiconductor radiation detector 700. The p+ cathodes and the n+ inserts have a hexagonal shape in FIG. 7B, but they may have other shapes, such as circular shape, in other embodiments. A detector anode 701 preferably is at the center of the semiconductor radiation detector 700. The p+ cathodes and the n+ inserts shown in FIGS. 7A and 7B are for illustrative purposes only, and there may be additional p+ cathodes and n+ inserts surrounding the p+ cathodes and the n+ inserts illustrated in FIGS. 7A and 7B.

A resistor divider 703 preferably is used to bias each of the p+ cathodes at different potential. For example, since the resistor divider 703 has an internal resistance, the voltage applied at a pad 713 near the center of the semiconductor radiation detector is typically reduced when it is applied at the biasing point 720. Similarly, the voltage applied at the biasing point 716 is less than the voltage applied at the biasing point 720, and so on. The resistor divider 703 to bias the p+ cathodes may be made of implanted or diffused p+ regions, e.g., using boron (B), on the bulk material, or the resistor divider 703 may be made of polysilicon.

The potential at the n+ inserts is more positive than the potential at adjacent p+ cathodes. For example, the potential at the n+ insert 710 preferably is more positive than the potential at the p+ cathodes 704 and 706. For another example, the potential at the n+ insert 708 is more positive than the potential at the p+ cathodes 702 and 704. The bias for the n+ inserts may be provided via the resistor divider 703, as is illustrated in FIG. 7B. The n+ regions 708 and 710 preferably are biased at the biasing points 714 and 718 through conductives 709 and 711, respectively. Conductives 705 and 707 preferably are used to bias other n+ inserts (not shown).

In other embodiments, each biasing point may be biased individually without using a resistor divider. For example, each biasing point may be individually bonded to an outside voltage source. In still other embodiments, some of the biasing points may be biased individually while other biasing points may be biased using a resistor divider.

The distance between adjacent p+ cathodes preferably are in the range of approximately 10 to 30 $\mu$m. The width of the p+ cathodes preferably are in the range of approximately 10 to 200 $\mu$m. The depth-integrated doping concentration of the n+ inserts preferably is at least an order of magnitude higher than the surface charge density, $Q_f$. From an electrical point of view, there typically is no upper limit on how high the doping concentration of the n+ inserts can be, but dopants preferably are not diffused into the bulk semiconductor material more than approximately 1 to 2 $\mu$m deep. The n+ inserts may occupy as much as 100% of the space between the adjacent p+ cathodes, or the n+ inserts may be just large enough to apply bias. The n+ inserts preferably occupy 100% of the space between the multiple p+ electrodes, excluding the area required for the resistor divider to bias the p+ electrodes.

In one embodiment of the present invention, at least one spiral guard structure is fabricated on the semiconductor radiation detector to control the potential at the detector edges and to prevent the premature breakdown of the device. The spiral guard also helps to decrease the detector dark current, reduce electronic noise, and results in a semiconductor radiation detector that is more immune to changes in ambient conditions.

Figure 8A:
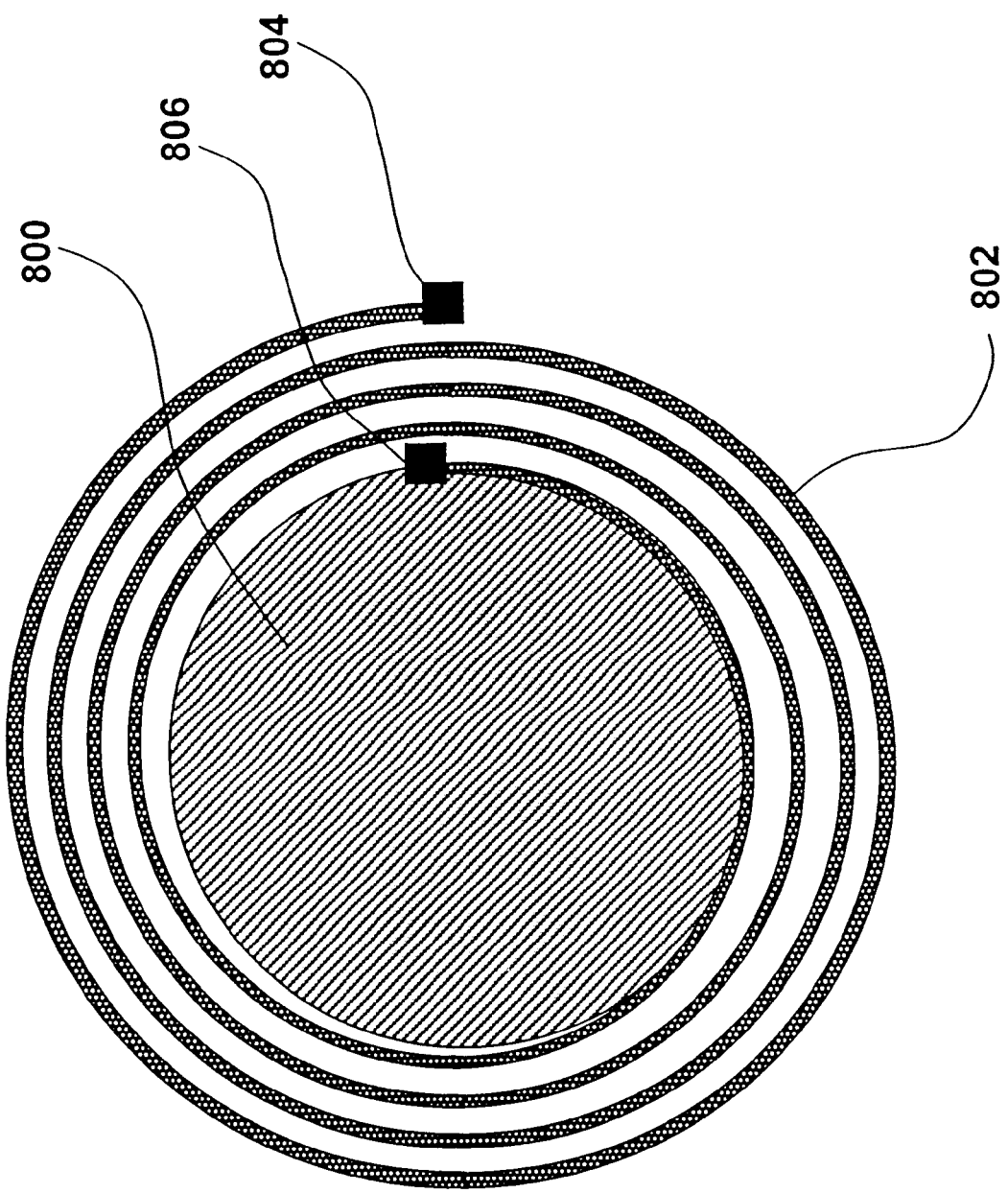
FIG. 8A is a plan view of a spiral guard structure fabricated in polysilicon with the appropriate resistivity in one embodiment of the present invention.

FIG. 8A is a schematic plan view of a spiral guard structure 802 surrounding an active area of a semiconductor radiation detector 800 in one embodiment of the present invention. The spiral guard structure 802 is illustrated in relation to the n-type bulk material and a p+ contact 806. Both the front side (entrance electrode side) and the back side (anode side) of the detector 800 preferably have a spiral guard structure 802 surrounding the active area of the detector.

The spiral guard structure preferably is made up of polysilicon, doped to the appropriate resistivity with p-type or n-type dopants. The polysilicon guard spiral may be exposed to the ambient or covered with an insulating material, such as silicon nitride or silicon dioxide. In other embodiments, the spiral guard may be made of other suitable materials. The electrical connections to the spiral guard may be ohmic at a biasing point 804, to allow for biasing or grounding of the spiral guard structure 802. For example, the potential applied at the biasing point 804 may be 0 Volts.

Figure 8B:
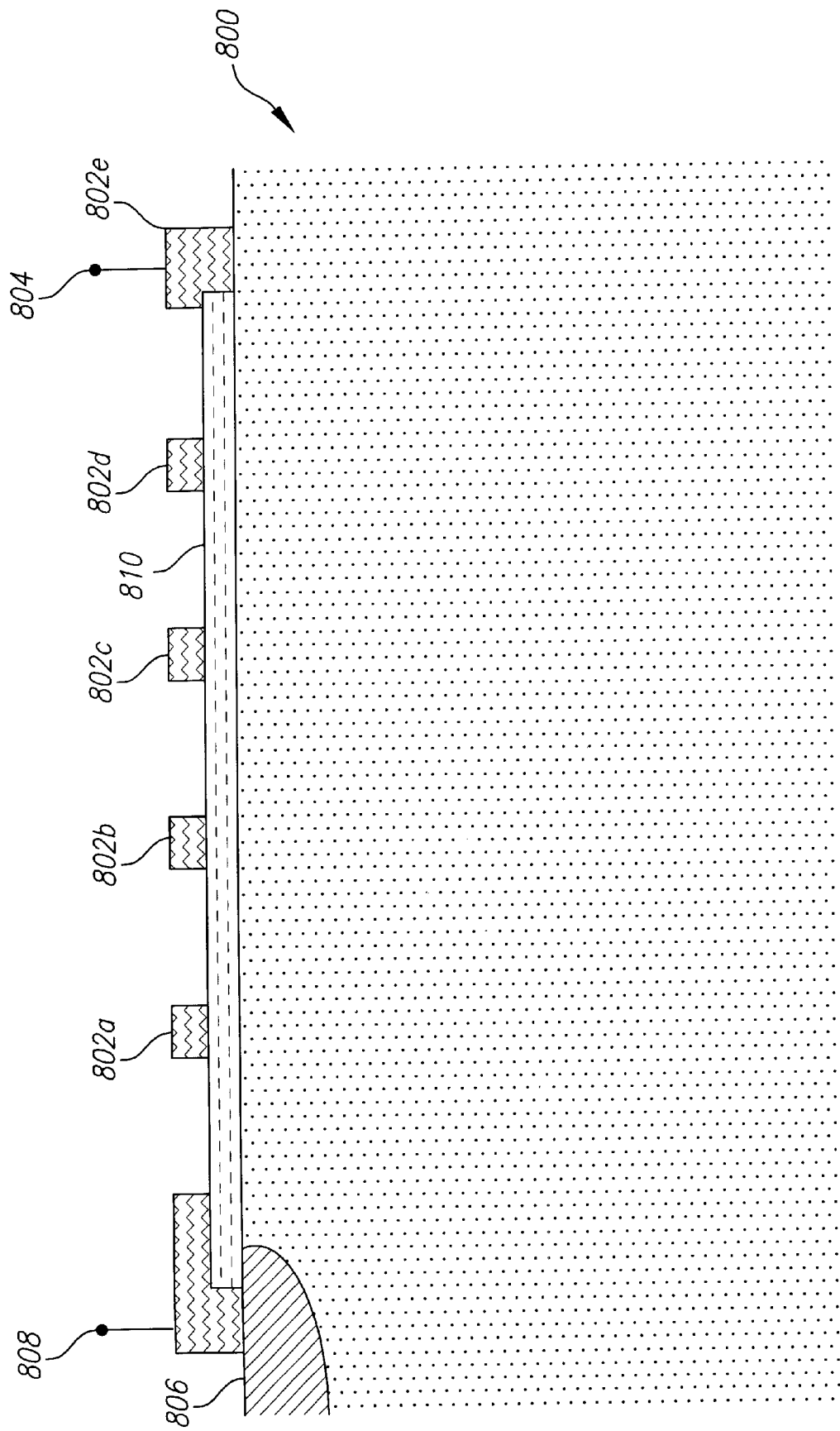
FIG. 8B is a cross-sectional view of the spiral guard structure of FIG. 8A.

FIG. 8B is a schematic cross-sectional view of the spiral guard structure surrounding the active area of the detector 800. The spiral guard structure represented by guard portions 802a, 802b, 802c, 802d and 802e preferably are fabricated on an oxide layer 810. The width of the polysilicon spiral guard preferably is to be the smallest reliably achievable, but in practice, will typically be on the order of approximately 3 to approximately 8 $\mu$m wide, with an acceptable width of less than approximately 200 $\mu$m. The oxide gap between adjacent polysilicon lines, e.g., between the guard portions 802a and 802b, of the guard spiral preferably is between approximately 3 to approximately 20 $\mu$m, with a maximum gap of approximately 500 $\mu$m.

The total resistance of the spiral guard structure preferably is such that the current will be in the approximately 500 nA to approximately 5 $\mu$A range during operation. For the case in which the individual detector elements form a monolithic array (e.g., as shown in FIG. 4D), the spiral guard structure on both sides of the detector preferably surrounds the periphery of the array. In other words, the spiral structure preferably does not wrap around each detector element individually.

When the electric potential lines are not perpendicular to the surface or unevenly distributed, high electric fields tend to be concentrated at certain points near the surface, and this in turn may lead to premature breakdown of the detector. The spiral polysilicon guard design allows for a more uniform drop in voltage from the outer edge of the detector to the active detector region, and reduces high field concentrations at the surface. The reduction of high field concentrations at the surface decreases the likelihood of catastrophic premature breakdown of the detector.

Figure 9:
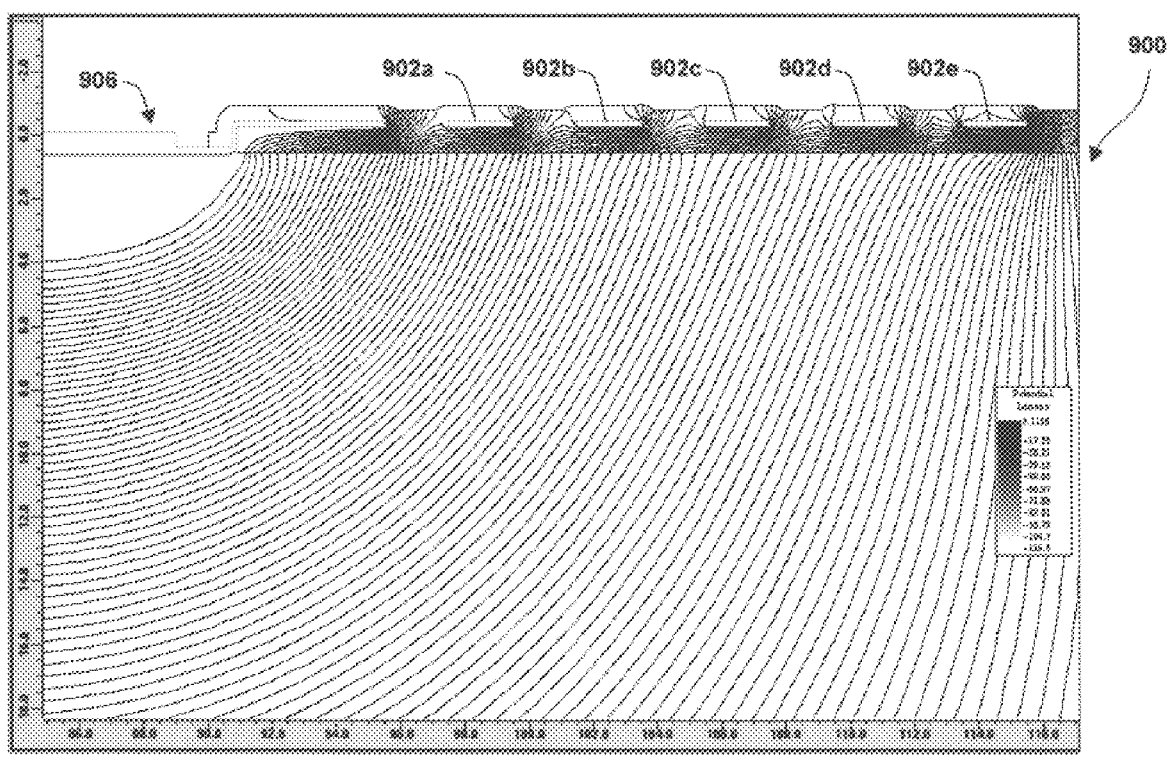
FIG. 9 is a cross-sectional schematic of a semiconductor radiation detector with calculated electric potential lines showing the merits of the polysilicon spiral guard structure, with all potential lines smoothly distributed along the semiconductor surface instead of crowding at the edges of the p+ electrodes.

For example, FIG. 9 is a cross-sectional schematic of a detector with a spiral guard structure. Electric potential lines during operation of the detector are illustrated. As seen in FIG. 9, the spiral guard structure (guard portions 902a, 902b, 902c, 902d and 902e) causes the electric potential lines to terminate substantially perpendicular to the detector surface and the electric field to be substantially uniformly distributed along the detector surface.

The guard structure may be used with various different types of detectors to improve their performance including but not limited to: drift detectors, p-i-n photo diodes, x-ray and particle detectors and strip detectors. The guard structure may also be applicable to various different active area shapes including but not limited to: circular and hexagonal shapes. The guard structure may be applicable to various different semiconductor materials including but not limited to silicon, and may be applicable to both n-type and p-type substrates and may have either n-type or p-type polysilicon doping.

Having now described the invention in accordance with the requirements of the patent statutes, those skilled in this art will understand how to make changes and modifications in the present invention to meet their specific requirements or conditions. Such changes and modifications may be made without departing from the scope and spirit of the invention as set forth in the following claims.

For example, although the example discussed here is the case of a detector with an n-type bulk, with multiple p+ electrodes (p+ cathodes) surrounding the n+ signal collection anode (detector anode), and with a p+ entrance window, in other embodiments, devices with reverse type doping regions may be fabricated. In other words, the embodiments described herein may also be produced with a p-type bulk, multiple n+ electrodes surrounding a p+ signal electrode and an n+ entrance window contact.

What is claimed is:

1. A radiation detector formed on a semiconductor material comprising:

first and second major surfaces and an edge surface, the edge surface being thinner in width than the major surfaces;

a rectifying entrance electrode on or affixed to the first major surface;

a second rectifying electrode formed on the second major surface, the second rectifying electrode comprising a plurality of electrodes;

a collection electrode located on the second major surface, the collection electrode comprising an ohmic contact; and biasing areas for applying predetermined bias voltages to the electrodes in order to reverse bias rectifying junctions and to steer bulk majority charge carriers produced by radiation interactions in the detector towards the collection electrode, wherein the rectifying entrance electrode is segmented into segments as to provide an undepleted region having a substantially uniform thickness across the entrance electrode when the predetermined bias voltages are applied.

2. The radiation detector of claim 1 wherein the semiconductor material is n-type, the rectifying electrodes are p-type, and the collection electrode is comprised of an n-type anode.

3. The radiation detector of claim 2, wherein n+ inserts are placed between the plurality of rectifying electrodes on the second major surface.

4. The radiation detector of claim 3, wherein the n+ inserts are floating.

5. The radiation detector of claim 3, wherein the n+ inserts are biased differently from one another.

6. The radiation detector of claim 3 wherein the plurality of rectifying electrodes on the second major surface are biased differently from one another.

7. The radiation detector of claim 6 wherein each of the n+ inserts are biased at higher potential than adjacent ones of the rectifying electrodes.

8. The radiation detector of claim 6 further comprising a resistor divider, wherein the resistor divider is used to bias the plurality of rectifying electrodes.

9. The radiation detector of claim 8 wherein the resistor divider is used to bias the n+ inserts.

10. The radiation detector of claim 9 wherein the resistor divider is external to the detector.

11. The radiation detector of claim 9 wherein the resistor divider is integrated into-the detector structure.

12. The radiation detector of claim 9 wherein the resistor divider is comprised of portions that are integrated into the detector structure and other portions that are external to the detector.

13. The radiation detector of claim 8 wherein the resistor divider is external to the detector.

14. The radiation detector of claim 8 wherein the resistor divider is integrated into the detector structure by p+ doping of the bulk material.

15. The radiation detector of claim 8 wherein the resistor divider is integrated into the detector structure by depositing doped polysilicon.

16. The radiation detector of claim 8 wherein the resistor divider is comprised of portions that are integrated into the detector structure and other portions that are external to the detector.

17. The radiation detector of claim 2 further comprising a plurality of n+ electrodes formed on the first major surface of the semiconductor material, wherein the n+ electrodes are placed between the segments of the p-type rectifying entrance electrode.

18. The radiation detector of claim 2 wherein the n+ electrodes are biased differently from one another.

19. The radiation detector of claim 1 wherein the rectifying entrance electrode is segmented through doping with variable doping concentrations.

20. The radiation detector of claim 19 wherein the rectifying entrance electrode is segmented such that portions of the entrance electrode that are radially equidistant from the center of the entrance electrode are doped with substantially the same doping concentration.

21. The radiation detector of claim 19 wherein the rectifying entrance electrode is physically segmented by inserting separation regions between the segments.

22. The radiation detector of claim 21 wherein the segments are biased differently from one another.

23. The radiation detector of claim 22 wherein the separation regions are biased differently from one another.

24. The radiation detector of claim 1 wherein the rectifying entrance electrode is physically segmented by inserting separation regions between the segments.

25. The radiation detector of claim 24 wherein the segments are biased differently from one another.

26. The radiation detector of claim 25 wherein the separation regions are biased differently from one another.

27. The radiation detector of claim 1 wherein the semiconductor material is p-type, the rectifying junctions are n-type, and the collection electrode is comprised of a p-type cathode.

28. A radiation detector formed on a semiconductor material comprising:

first and second major surfaces and an edge surface, the edge surface being thinner in width than the major surfaces;

a rectifying entrance electrode on or affixed to the first major surface;

a second rectifying electrode formed on the second major surface, the second rectifying electrode comprising a plurality of electrodes;

a collection electrode located on the second major surface, the collection electrode comprising an ohmic contact; and biasing areas for applying predetermined bias voltages to the electrodes in order to reverse bias rectifying junctions and to steer bulk majority charge carriers produced by radiation interactions in the detector towards the collection electrode; and a guard structure that extends around an active area of the semiconductor detector on at least one of the first and second major surfaces, wherein the rectifying entrance electrode is segmented into segments as to provide an undepleted region having a substantially uniform thickness across the entrance electrode when the predetermined bias voltages are applied, and wherein the guard structure is used to terminate the electric fields.

29. The radiation detector of claim 28 wherein the guard structure is comprised of a biased spiral structure, and is placed around the active area of the entrance electrode on the first major surface.

30. The radiation detector of claim 29 wherein the biased spiral guard structure is comprised of polysilicon.

31. The radiation detector of claim 28 wherein the guard structure is comprised of a biased spiral structure, and is placed around the plurality of rectifying electrodes on the second major surface.

32. The radiation detector of claim 28 wherein the guard structure is comprised of a biased spiral structure, and is placed on both the first major surface and the second major surface.

33. A radiation detector formed on a semiconductor material comprising:
- first and second major surfaces and an edge surface, the edge surface being thinner in width than the major surfaces;
- a rectifying entrance electrode on or affixed to the first major surface;
- a second rectifying electrode formed on the second major surface, the second rectifying electrode comprising a plurality of electrodes;
- a collection electrode located on the second major surface, the collection electrode comprising an ohmic contact and providing an output; and
- biasing areas for applying predetermined bias voltages to the electrodes in order to reverse bias rectifying junctions and to steer bulk majority charge carriers produced by radiation interactions in the detector towards the collection electrode,
- wherein the collection electrode is coupled to an external transistor used to receive the output and to provide the output to readout electronics, and the external transistor is coupled in a manner as to reduce coupling noise and parasitic capacitance.

34. The radiation detector of claim 33 wherein the external transistor is selected form a group consisting of a JFET, a BJT and a MOSFET.

35. The radiation detector of claim 33 wherein the collection electrode is coupled to the external transistor using a bump bonding technique.

36. The radiation detector of claim 33 further comprising an isolating interconnection layer between the detector and the transistor, and wherein the collection electrode is coupled to ea gate terminal of the transistor using bump bonding techniques, and at least one of other transistor terminals is coupled to the isolating interconnection layer.

37. The radiation detector of claim 36 wherein the isolating interconnection layer is comprised of a material selected from a group consisting of a thin polyester film and a ceramic substrate.

38. The radiation detector of claim 33 further comprising an isolating interconnection layer supporting the external transistor, wherein the collection electrode is coupled to a gate terminal of the external transistor using a wire bonding technique.

39. The radiation detector of claim 33 wherein the collection electrode is micro-machined as to create a hole with an opening in the collection electrode, the external transistor is fabricated on a transistor die, and wherein the transistor die is micro-machined as to allow the external transistor to fit within the hole in the collection electrode.

40. A radiation detector formed on a semiconductor material, the radiation detector comprising an array of detector elements, wherein each detector element is comprised of:
- first and second major surfaces;
- a rectifying entrance electrode on or affixed to the first major surface;
- a second rectifying electrode formed on the second major surface, the second rectifying electrode comprising a plurality of electrodes;
- a collection electrode located on the second major surface, the collection electrode comprising an ohmic contact; and
- biasing areas for applying predetermined bias voltages to the electrodes in order to reverse bias rectifying junctions and to steer bulk majority charge carriers produced by radiation interactions in the detector towards the collection electrode,
- wherein the rectifying entrance electrode is segmented into segments as to provide an undepleted region having a substantially uniform thickness across the entrance electrode when the predetermined bias voltages are applied.

41. The radiation detector of claim 40 wherein the rectifying entrance electrode of each detector element is segmented through doping with variable doping concentrations.

42. The radiation detector of claim 40 wherein the rectifying entrance electrode of each detector element is physically segmented by inserting separation regions between the segments.

43. The radiation detector of claim 40 further comprising a guard structure that extends around an active area of one or more detector elements on at least one of the first and second major surfaces of the detector elements, wherein the guard structure is used to terminate the bias voltages.

* * * * *

UNITED STATES PATENT AND TRADEMARK OFFICE
CERTIFICATE OF CORRECTION

PATENT NO.     : 6,455,858 B1
DATED          : September 24, 2002
INVENTOR(S)    : Patt et al.

It is certified that error appears in the above-identified patent and that said Letters Patent is hereby corrected as shown below:

Column 15,
Line 44, replace "into-the" with -- into the --.
Line 66, replace "claim 2" with -- claim 17 --.

Column 17,
Line 26, replace "form" with -- from --.
Line 34, replace "ea" with -- a --.

Signed and Sealed this

Twelfth Day of August, 2003

JAMES E. ROGAN
*Director of the United States Patent and Trademark Office*